United States Patent
Kobatake

(10) Patent No.: US 8,085,610 B2
(45) Date of Patent: Dec. 27, 2011

(54) SRAM AND TESTING METHOD OF SRAM

(75) Inventor: Hiroyuki Kobatake, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 192 days.

(21) Appl. No.: 12/699,243

(22) Filed: Feb. 3, 2010

(65) Prior Publication Data

US 2010/0226190 A1    Sep. 9, 2010

(30) Foreign Application Priority Data

Feb. 3, 2009    (JP) ................................. 2009-022205

(51) Int. Cl.
*G11C 29/00* (2006.01)
(52) U.S. Cl. ........................................ 365/201; 365/203
(58) Field of Classification Search .................. 365/201, 365/203
See application file for complete search history.

(56) References Cited

U.S. PATENT DOCUMENTS

| | | | |
|---|---|---|---|
| 6,778,451 B2 * | 8/2004 | Takahashi et al. | 365/201 |
| 7,672,181 B2 * | 3/2010 | Mori et al. | 365/201 |
| 2003/0072187 A1 * | 4/2003 | Takahashi et al. | 365/189.07 |
| 2008/0137456 A1 * | 6/2008 | Shimosaka | 365/201 |
| 2009/0040851 A1 * | 2/2009 | Mori et al. | 365/201 |

FOREIGN PATENT DOCUMENTS

JP    7-182895    7/1995

OTHER PUBLICATIONS

Meixer et al. "Weak Write Test Mode: An SRAM Cell Stability Design for Test Technique", International Test Conference, Paper BP, IEEE, 0-7803-4209-7/1997.

* cited by examiner

*Primary Examiner* — Tuan T. Nguyen
(74) *Attorney, Agent, or Firm* — Young & Thompson

(57) ABSTRACT

An SRAM includes a memory cell; and a control circuit configured to change a signal level of a signal which is used in an ordinary mode for access to the memory cell in a test mode to apply a disturbance to the memory cell. The control circuit can change the signal level to set a level of the disturbance optionally.

12 Claims, 18 Drawing Sheets

SRAM AND TESTING METHOD OF SRAM

INCORPORATION BY REFERENCE

This patent application claims a priority on the convention based on Japanese Patent Application No. 2009-022205. The disclosure thereof is incorporated herein by reference.

TECHNICAL FIELD

The present invention relates to an SRAM and a testing method of the SRAM.

BACKGROUND ART

FIG. 1 is a circuit diagram showing the configurations of a memory cell 100 and a peripheral circuit in a typical CMOS (Complementary Metal-Oxide Semiconductor) type of SRAM. With reference to FIG. 1, the memory cell 100 contains a positive feedback loop (flip-flop) of two CMOS inverters INV10 and INV20; and two N-channel MOS transistors N110 and N120 (hereinafter, to be referred to as selection transistors N110 and N120) for controlling connection between each of bit lines BL10 and BL20 and one of the inverters INV10 and INV20. In detail, the two inverters INV10 and INV20 are connected between a first power supply voltage VDD and a second power supply voltage (GND). The output of the inverter INV10 is connected to the input of the inverter INV20 through a node ND110, and the output of the inverter INV20 is connected to the input of the inverter INV10 through a node ND120. The node ND110 is connected to the bit line BL10 through the selection transistor N110 whose gate is connected to a word line WL100, and the node ND120 is connected to the bit line BL20 through the selection transistor N120 whose gate is connected to the word line WL100.

When the word line WL100 is activated, the selection transistors N110 and N120 are turned on, and the node pairs ND110 and ND120 are electrically connected to the bit lines BL10 and BL20, respectively. Consequently, the nodes ND110 and ND120 hold the voltages supplied from the bit lines BL10 and BL20, respectively (Data Write). Or, the voltages held by the nodes ND110 and ND120 are supplied to a sense amplifier (not shown) through the bit lines BL10 and BL20. The sense amplifier compares the input voltage with a threshold and determines the value of a data (Data Read). In this way, the write of the data to the memory cell 100 or the read of the data from the memory cell 100 is carried out.

Also, before the data is written and read, the pair of bit lines BL10 and BL20 is pre-charged to the power supply voltage VDD by a pre-charging circuit 200. The pre-charging circuit 200 contains P-channel MOS transistors P10 and P20 (hereinafter, to be referred to as pre-charge transistors P10 and P20), which electrically connect the first power supply voltage VDD and the bit line pairs BL10 and BL20, on the basis of a pre-charge control signal PRB10 supplied to the gates.

When a read test is performed on the SRAM configured as mentioned above, there is a case that a memory cell, in which SNM (Static Noise Margin) is small and a defect generation rate is high, cannot be detected as a defect cell.

The operation of a conventional read test and its problem will be described below with reference to FIGS. 1 and 2. FIG. 2 shows timing charts in the conventional read test.

Until a time T1, "1" is written to the node ND110, and "0" is written to the node ND120. At the time T1, the pre-charge control signal PRB10 is changed to a low level, so that the bit lines BL10 and BL20 are pre-charged to a high level. At a time T2, the pre-charge control signal PRB10 is changed to the high level, so that the connection between each of the bit lines BL10 and BL20 and the first power supply VDD is disconnected. Also, the word line WL100 is activated to select the memory cell. Thus, the data written in the memory cell 100 is read.

In the period between the time T2 and a time T3 at which the word line WL100 is inactivated, the voltage of the node ND120 that holds the data "0" is increased by the bit line BL20 pre-charged to the high level. Here, if the memory cell 100 is in a normal state, the voltage of the node ND120 is increased only to a voltage lower than the logical threshold voltage of the inverter INV10. For this reason, the voltage of the node ND120 returns to the low level (the data "0") in association with the discharging of the bit line BL20. In this case, the data read until the time T3 is the same as the write data, and the memory cell is determined to be in the normal state. On the other hand, if the memory cell 100 is in an abnormal state, the voltage of the node ND120 exceeds the logical threshold voltage of the inverter INV10, the inverted data different from the write data is read (not shown). In this case, the memory cell is determined to be in the abnormal state.

However, even if the memory cell 100 is in the abnormal state, there is a case that the voltage of the node ND120 is increased only to the voltage lower than the logical threshold voltage of the inverter INV10, so that the write data is not inverted. This is for the reason why the charges on the bit line BL20 are fast discharged when the data is read out, as compared with the voltage increase of the node ND120. In this way, even if the memory cell 100 is in the abnormal state, there is a case that the same data is as the write data is read out and the operation is determined to be no error (normal).

The same operation as in the period between the times T1 and T3 is repeated in the period between the times T3 and T5.

As mentioned above, there is a case that the memory cell in the abnormal state cannot be detected even if the SNM is checked by the conventional read test method. A test circuit for solving such a problem is described in, for example, "Weak Write Test Mode: An SRAM Cell Stability Design for Test Technique" (International test conference, 1997) by Anne Meixner, Jash Banik (Non-Patent Literature 1).

The operation of a read test using the testing circuit described in the non-patent document 1 will be described below with reference to FIGS. 3 and 4. FIG. 3 is a circuit diagram showing the configurations of a memory cell 100 and a peripheral circuit (a pre-charging circuit 200 and a testing circuit 300) that are described in the non-patent document 1. FIG. 4 shows timing charts in a read test that uses the testing circuit 300 described in the non-patent document 1.

The operation between a test start and a time T2 are same as the operation of the conventional example shown in FIG. 2. At the time T2, the pre-charge control signal PRB10 is changed to the high level, and the word line WL100 is activated, and the memory cell is selected. At this time, a control signal WR0 supplied to the testing circuit 300 is switched to the high level, and a control signal WR1 is switched to the low level. Consequently, the voltage of the bit line BL20 is increased to the first power supply voltage VDD, and the voltage of the bit line BL10 is decreased to the GND voltage.

Since the voltage of the node ND120 is increased and the voltage of the node ND110 is decreased, the logical threshold voltage of the inverter INV10 is decreased as compared with an actual value, and the logical threshold voltage of the inverter INV20 is increased. That is, by the testing circuit 300, the data held at the nodes ND110 and ND120 are set to be easily inverted. For this reason, even in the memory cell in which the data is not inverted in the conventional technique, the write data is inverted by the connection of the pre-charged bit line BL20, so that the abnormal state of the memory cell can be detected. Here, the testing circuit 300 pulls up or pulls down the node voltage so that the data is not inverted in a case of the memory cell in the normal state. Thus, according to the method described in the non-patent literature 1, it is possible to detect the memory cell in the abnormal state that cannot be detected in the conventional technique because the SNM is small.

Also, a technique that changes impedance of a load circuit in an inverter of the memory cell so that data held at a node is easily inverted, is described Japanese Patent Application (JP-A-Heisei, 7-182895) (refer to a patent literature 1).

However, in the technique described in the non-patent literature 1, the testing circuit 300 is newly added, thereby increasing the entire circuit area of a semiconductor device. Also, in the technique described in the patent literature 1, it is necessary to insert a load resistance whose impedance is changed on the basis of a test signal, for each memory cell. For this reason, a technique is demanded to detect the memory cell in which the SNM is small and the defect generation probability is high, without any increase in the circuit area.

SUMMARY OF THE INVENTION

In an aspect of the present invention, an SRAM includes: a memory cell; and a control circuit configured to change a signal level of a signal which is used in an ordinary mode for access to the memory cell in a test mode to apply a disturbance to the memory cell. The control circuit can change the signal level to set a level of the disturbance optionally.

In another aspect of the present invention, a method of testing an SRAM, is achieved by writing a data in a memory cell; and by applying a disturbance to the memory cell by changing a signal level of a signal which is used for an access to the memory cell in a test mode, the signal level being different from that in an ordinary mode. The signal level is changeable so as to set a level of the disturbance optionally.

According to the present invention, it is possible to improve the detection sensibility of the abnormal memory cell whose SNM is small, while suppressing the increase in the circuit area of the SRAM.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE EMBODIMENTS

Figure 1:
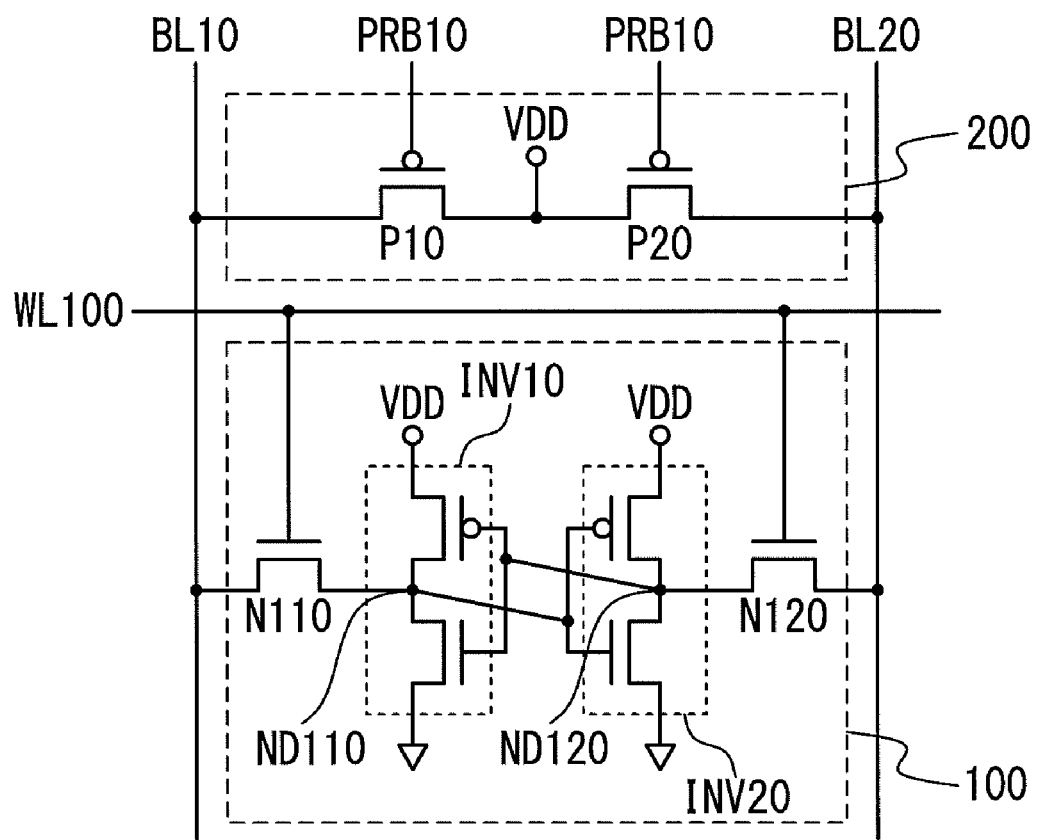
FIG. 1 is a circuit diagram showing one example of a part of a conventional SRAM.
Figure 2:
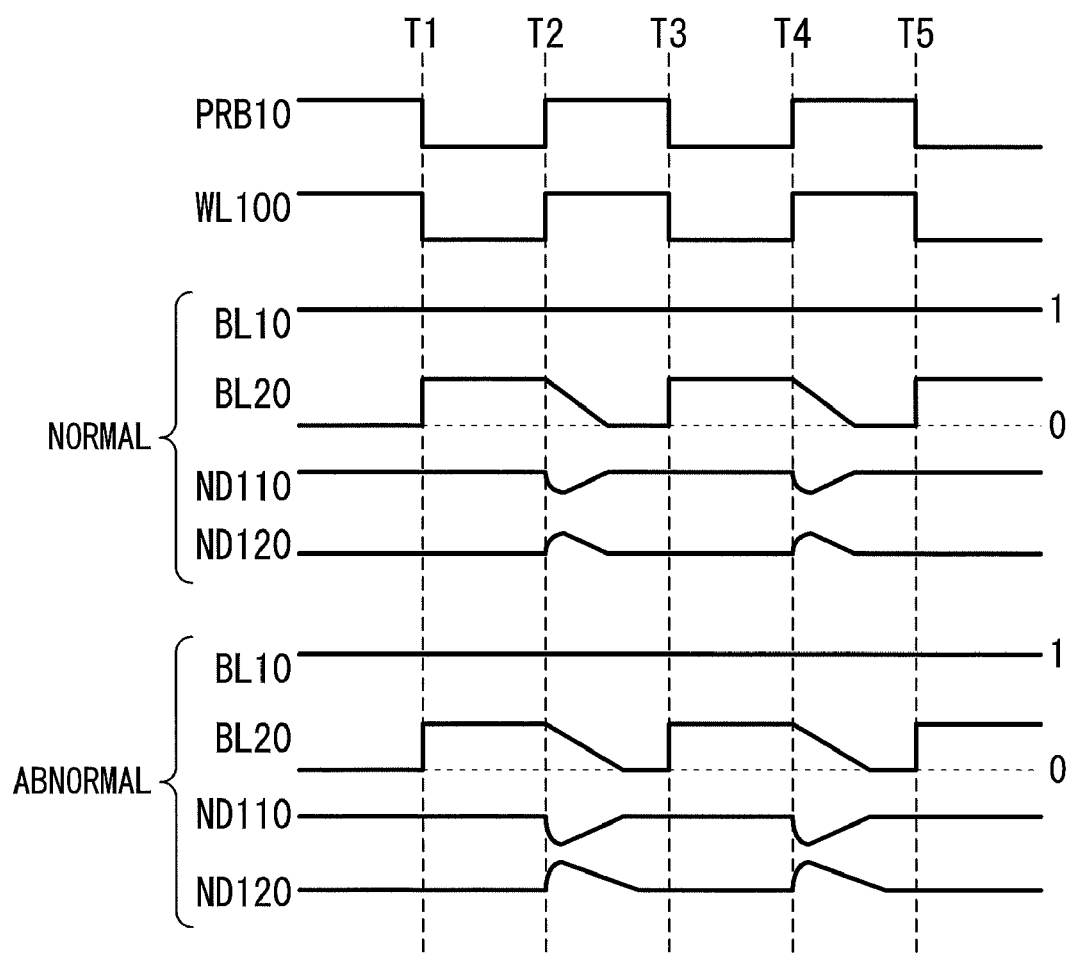
FIG. 2 shows timing charts in a read test of the conventional SRAM.
Figure 3:
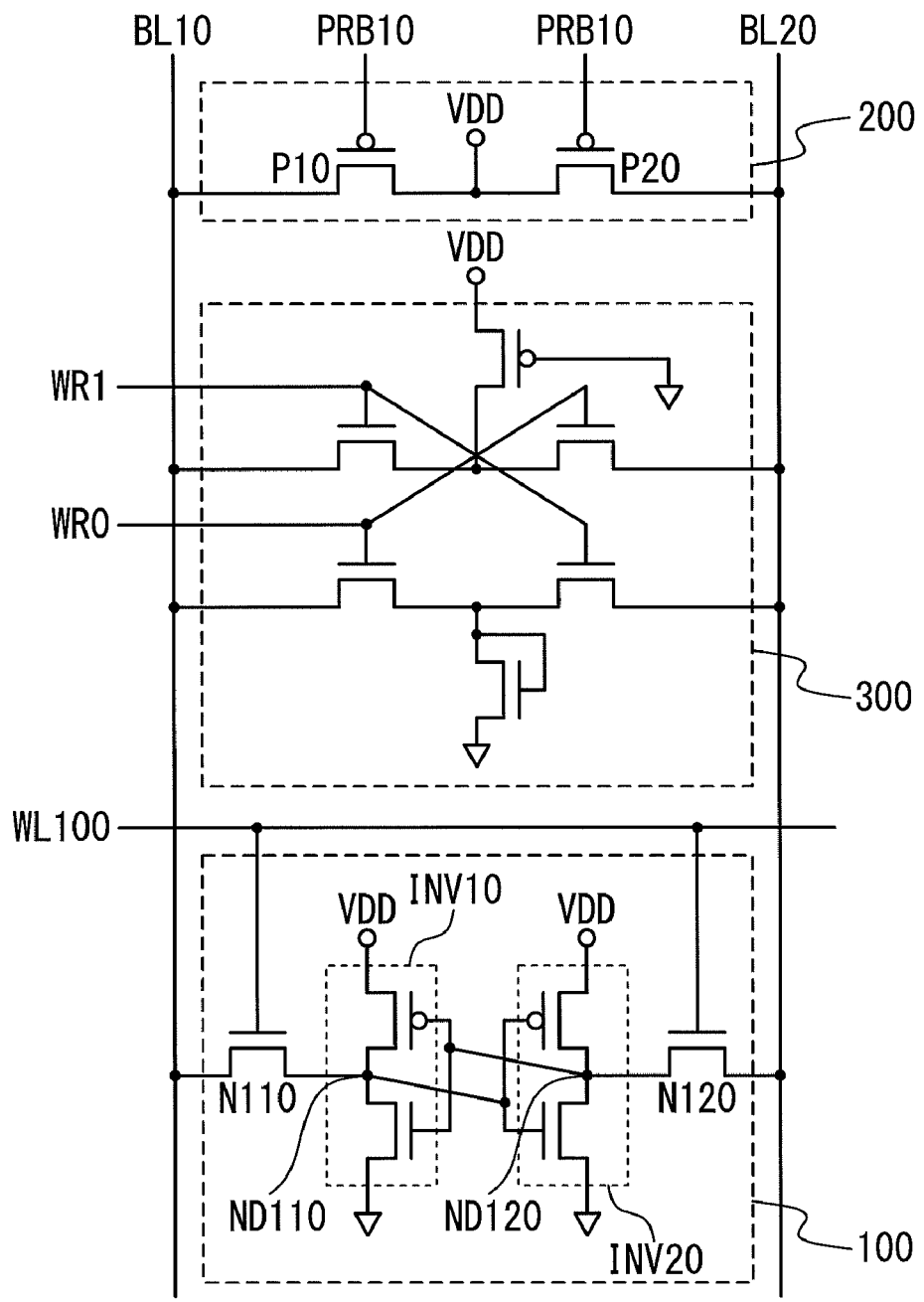
FIG. 3 is a circuit diagram showing another example of a conventional SRAM.
Figure 4:
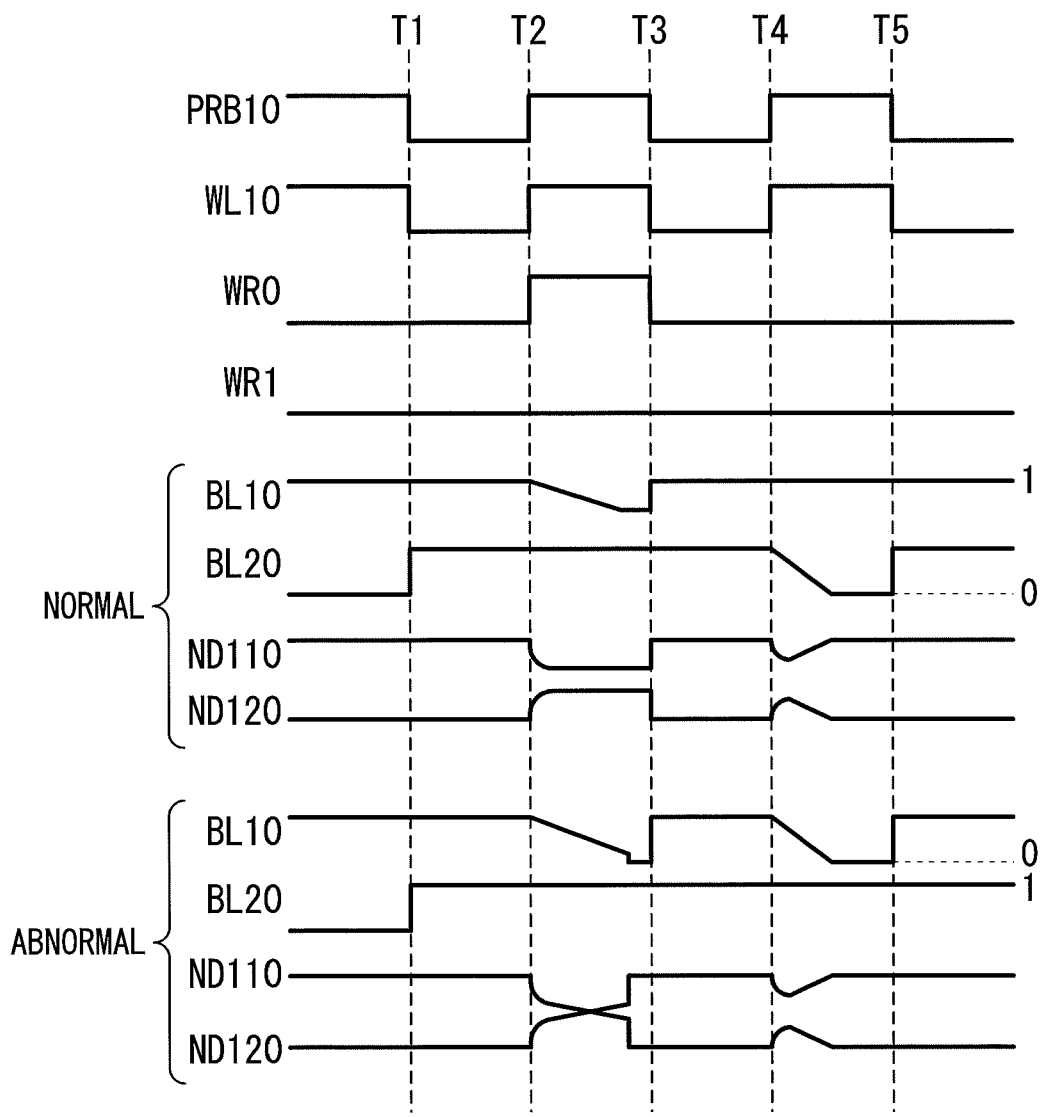
FIG. 4 shows timing charts in another example of the read test of the conventional SRAM.

Hereinafter, an SRAM according to the present invention will be described with reference to the attached drawings. The SRAM contains a plurality of memory cells, which are connected to a plurality of word lines and a plurality of bit line pairs and arranged in a matrix. A pre-charging circuit is connected to each of the plurality of memory cells. In the drawings, same reference symbols are assigned to same components.

First Embodiment

The SRAM according to a first embodiment of the present invention and a read test method for the SRAM will be described below with reference to FIGS. 5 and 6.

Figure 5:
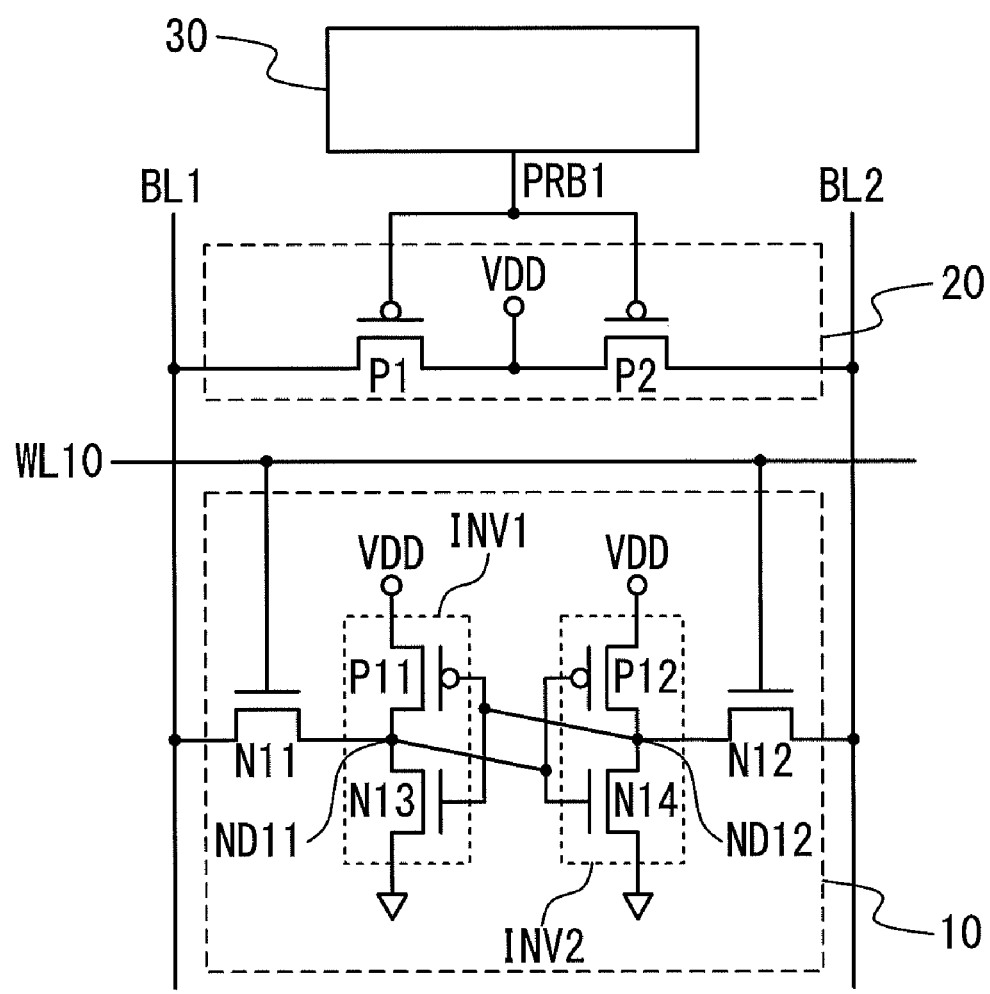
FIG. 5 is a circuit diagram showing a configuration of an SRAM according to a first embodiment of the present invention.
Figure 6:
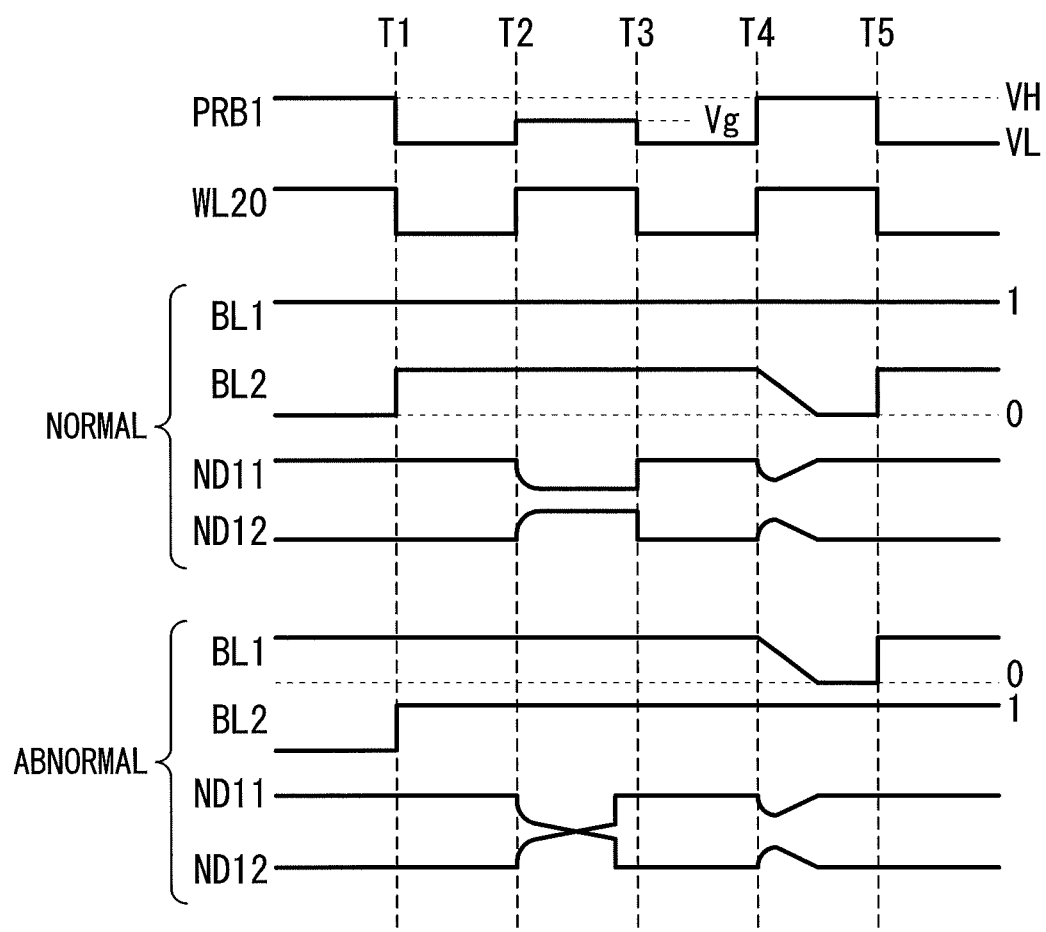
FIG. 6 shows timing charts in a read test of the SRAM in the first embodiment.

FIG. 5 is a circuit diagram showing a part of the configuration of the SRAM in the first embodiment. The SRAM in the first embodiment contains a memory cell 10, which is connected to bit lines BL1 and BL2 and a word line WL10, a pre-charging circuit 20 for pre-charging the bit lines BL1 and BL2; and a pre-charge control circuit 30 for controlling the pre-charging circuit 20. The pre-charge control circuit 30 also controls a pre-charging circuit connected to another bit line pair (not shown).

With reference to FIG. 5, the memory cell 10 contains a positive feedback loop (flip-flop) of two CMOS inverters INV1 and INV2; and two N-channel MOS transistors N11 and N12 (hereinafter, to be referred to as selection transistors N11 and N12) for controlling the connections between the bit lines BL1 and BV2 and the inverters INV1 and INV2, respectively. In detail, the two inverters INV1 and INV2 are connected between a first power supply voltage VDD and a second power supply voltage GND. The inverter INV1 contains a P-channel MOS transistor P11 and an N-channel MOS transistor N13, which are connected through a node ND11. The inverter INV2 contains a P-channel MOS transistor P12 and an N-channel MOS transistor N14, which are connected through a node ND12. The output of the inverter INV1 is connected through the node ND11 to the input of the inverter INV2, and the output of the inverter INV2 is connected through the node ND12 to the input of the inverter INV1. The node ND11 is connected to the bit line BL1 through the selection transistor N11 whose gate is connected to the word line WL10, and the node ND12 is connected to the bit line BL2 through the selection transistor N12 whose gate is connected to the word line WL10.

When the word line WL10 is activated, the selection transistors N11 and N12 are turned on, and the nodes ND11 and ND12 are electrically connected to the bit lines BL1 and BL2, respectively. Thus, the nodes ND11 and ND12 hold the voltages supplied from the bit lines BL1 and BL2, respectively (Data Write). Or, the voltages held at the nodes ND11 and ND12 are supplied through the bit lines BL1 and BL2 to a sense amplifier (not shown). The sense amplifier compares the supplied voltage with a threshold and determines the read data (Data Read). In this way, the write of the data to the memory cell 10 or the read of the data from the memory cell 10 is carried out.

The pre-charging circuit 20 contains a P-channel MOS transistor P1 connected between the first power supply voltage VDD and the bit line BL1, and a P-channel MOS transistor P2 connected between the first power supply voltage VDD and the bit line BL2. Hereinafter, the P-channel MOS transistors P1 and P2 are referred to as pre-charge transistors P1 and P2. The pre-charge transistor P1 controls the electrical connection between the bit line BL1 and the first power supply voltage VDD on the basis of a pre-charge control signal PRB1 supplied to the gate. The pre-charge transistor P2 controls the electrical connection between the bit line BL2 and the first power supply voltage VDD on the basis of the pre-charge control signal PRB1 supplied to the gate. At a time of a test mode, a common pre-charge control signal PRB1 is supplied to the pre-charge transistors P1 and P2 in the first embodiment, and the bit lines BL1 and BL2 are pre-charged at the same time.

In an ordinary mode, the pre-charge control circuit 30 outputs the pre-charge control signal PRB1 of a low level, before the data is written to and read from the memory cell, similarly to the conventional technique. The pre-charge control signal PRB1 is changed to a high level, when the data is written and read. Consequently, the pre-charging circuit 20 pre-charges the bit lines BL1 and BL2 before the data is written and read. On the other hand, in a read test mode, the pre-charge control circuit 30 carries out a control different from the ordinary mode. The detail of the operation of the read test mode will be described later. In the test mode, the pre-charge control circuit 30 may output the pre-charge control signal PRB1 on the basis of a control signal from an external test apparatus (not shown).

In the SRAM in the first embodiment, the pre-charging circuit 20 pulls up the bit lines BL1 and BL2 to an arbitrarily settable voltage in the test mode. Consequently, it is easy to increase the voltage of the node ND12, and it is easy to exceed the threshold voltage of the inverter INV11. In the present invention, since the value of the pre-charge control signal PRB1 (gate voltage) supplied to the pre-charging circuit 20 is changed to any value, the SNM of the memory cell 10 can be aggressively reduced, and it can be set to a state in which the data is easily inverted. Consequently, it is possible to detect the memory cell in the abnormal state in which SNM is small so that cannot be detected by the conventional method.

The detail of the operation of the SRAM in the first embodiment in the test mode will be described below with reference to FIG. 6. FIG. 6 shows timing charts in the read test for the SRAM in the first embodiment.

In the test mode, a data write (to a time T1), a pre-charging of bit lines (from a time T1 to a time t2), a SNM reduction process (from a time T2 to a time T3), a pre-charging of bit lines for the data read (from a time T3 to a time T4), a read of the data (from a time T4 to a time T5), and a determination of a normal/abnormal state (after the time T5) are carried out.

At first, until the time T1, the word line WL10 is activated, and "1" (a high level) is written to the node ND11, and "0" (a low level) is written to the node ND12. At this time, the pre-charging circuit 20 disconnects the connection between the first power supply voltage VDD and each of the bit lines BL1 and BL2 on the basis of the pre-charge control signal PRB1 of the high level, similarly to the ordinary mode. At the time T1, the pre-charge control signal PRB1 is changed to the low level (VL). Also, the word line WL10 is inactivated, so that the memory cell 10 is separated from the bit lines BL1 and BL2. The bit lines BL1 and BL2 are pre-charged to the high level by the pre-charging circuit 20.

At the time T2, the word line WL10 is activated. Also, the pre-charge control signal PRB1 is changed to a preset voltage Vg so that the pre-charging circuit 20 supplies predetermined voltages through the bit lines BL1 and BL2 to the nodes ND11 and ND12. Thus, the supply of the voltage to the nodes ND11 and ND12 from the pre-charging circuit 20 is carried out until the word line WL10 is inactivated at the time T3.

In detail, between the times T2 and T3, the pre-charge control circuit 30 changes the signal level of the pre-charge control signal PRB1 to the preset voltage Vg. When the pre-charge control signal PRB1 is set to the voltage Vg, the on-resistances of the pre-charge transistors P1 and P2 are decreased to predetermined values, respectively, and the bit lines BL1 and BL2 are increased to predetermined voltages, respectively. At this time, since the word line WL10 is active, the voltage of the node ND12 is increased to a predetermined voltage from the low level "0", and the voltage of the node ND11 is decreased to the predetermined voltage from the high level "1". Consequently, it becomes easy to increase the voltage of the node ND12, which holds the low level "0", as compared with the ordinary mode, and it becomes easy to exceed the logical threshold voltage of the inverter INV1. Or, it becomes easy to decrease the voltage of the node ND11, which holds the high level "1", as compared with the ordinary mode, and it becomes easy to fall below the logical threshold voltage of the inverter INV2. That is, since the predetermined voltage corresponding to the pre-charge control signal Vg is supplied to the bit lines BL1 and BL2 (the nodes ND1 and ND2), the SNM of the memory cell 10 is reduced, which leads to the state in which the data held by the memory cell 10 is easily inverted.

In the present invention, after the bit lines BL1 and BL2 are pre-charged, the signal level of the pre-charge control signal PRB1 is set to the arbitrarily settable voltage Vg. Thus, the on-resistances of the pre-charge transistors P1 and P2 are controlled to any values. Here, the voltage Vg is preferred to be set to any value between the high level (VH=VDD) and the low level (VL=0) of the pre-charge control signal PRB1. Consequently, the pre-charging circuit 20 can apply a disturbance of any level to the memory cell 10. That is, the reduction rate of the SNM of the memory cell 10 can be arbitrarily changed by the pre-charging circuit 20. For example, when the reduction rate of the SNM is set high (large disturbance), the charge-up performance of the node ND12 that holds the low level "0" is increased, and the voltage of the node ND12 is largely increased. On the contrary, when the reduction rate of the SNM is set small (small disturbance), the charge-up performance of the node ND12 that holds the low level "0" is decreased, and the increase amount of the voltage of the node ND12 is decreased.

Here, when the memory cell 10 is in the normal state, even if the SNM of the memory cell 10 is reduced, the increased voltage of the node ND12 does not exceed the logical threshold voltage of the inverter INV1, and the decreased voltage of the node ND11 does not fall below the logical threshold voltage of the inverter INV2. That is, even if the supply of the voltage from the pre-charging circuit 20 is performed (even if there is a disturbance), the data written in the memory cell 10 is not inverted.

On the other hand, in a case of the memory cell in which the SNM is small and a defect generation rate is high, the logical threshold voltage of the inverter INV1 or INV2 indicates an abnormal value. In this case, as compared with the memory cell in the normal state, the voltage of the node ND12 easily exceeds the logical threshold voltage of the inverter INV1, or the voltage of the node ND11 easily falls below the logical threshold voltage of the inverter INV2. When the memory cell 10 in such a state is disturbed by the pre-charging circuit 20, the voltage of the node ND12 is increased to the ordinary value or more. Here, when the logical threshold voltage of the inverter INV1 is low, the voltage of the node ND12 exceeds the logical threshold voltage of the inverter INV1. Thus, the data written in the memory cell 10 is inverted. For example, when the N-channel MOS transistor N14 has a high resistance as compared with that of the normal state, the voltage of the node ND12 is increased to the voltage higher than that of the memory cell in the normal state. Thus, this exceeds the logical threshold voltage of the inverter INV1. Also, when the selection transistor N12 has a low resistance as compared with that of the normal state, the voltage of the node ND12 is similarly increased to the voltage higher than that of the memory cell in the normal state. Thus, this exceeds the logical threshold voltage of the inverter INV1. Moreover, the P-channel MOS transistor P11 has a high resistance as compared with that of the normal state, the logical threshold voltage of the inverter INV1 takes a low value as compared with the memory cell in the normal state. Therefore, due to the voltage increase caused by the disturbance, the voltage of the node ND12 exceeds the logical threshold voltage of the inverter INV1. In such a case, the data held at the nodes ND11 and ND12 are inverted.

Between the times T3 and T4, the pre-charging process for the reading process of the data is carried out. In detail, the pre-charge control signal PRB1 is changed to the low level (VL), and the word line WL10 is inactivated. Accordingly, the pre-charging circuit 20 pre-charges the bit lines BL1 and BL2 to the high level. In succession, between the times T4 and T5, the data is read from the memory cell 10. Here, the pre-charge control signal PRB1 is changed to the high level (VH), and the word line WL10 is activated. Consequently, the first power supply voltage VDD and the bit lines BL1 and BL2 are separated, and the data is read from the memory cell 10.

When the data read from the memory cell 10 between the times T4 and T5 and the data written until the time T1 are coincident with each other, the memory cell 10 is determined to be in the normal state, and when both are different, it is determined to be in the abnormal state.

In the present invention, after the data is written, the pre-charging circuit 20 applies the high voltage to the nodes BL1 and BL2 so that the SNM of the memory cell 10 is forcedly reduced. Here, when the SNM of the memory cell 10 takes a normal value, even if the SNM becomes small, the held data is not inverted. On the other hand, in a case of the memory cell in the abnormal state that cannot be detected by the conventional method because the SNM of the memory cell 10 is smaller than a desirable value, the SNM is further reduced by the pre-charging circuit 20. Thus, the held data is inverted. In this way, in the present invention, since the SNM is reduced with any reduction rate by the pre-charging circuit 20, the detection sensibility of the memory cell in the abnormal state can be improved. Also, in the present invention, a level of the disturbance (the reduction rate of the SNM) can be arbitrarily set by the pre-charging circuit 20. Thus, the detection sensibility of the memory cell in the abnormal state can be changed on the basis of the specification and design condition of the circuit.

In the detecting operation of the memory cell in the abnormal state as mentioned above, until the time T1, the data "1" is held at the node ND11, and the data "0" is held at the node ND12. On the contrary, the inverted data may be written. That is, the read test may be carried out such that until the time T1, the data "0" is held at the node ND11, and the data "1" is held at the node ND12, and the operation similar to the above-described case is carried out. In this case, it is possible to detect the memory cell in the abnormal state in which the N-channel MOS transistor N13 has a high resistance, the memory cell in the abnormal state in which the selection transistor N11 has a low resistance, and the memory cell in the abnormal state in which the P-channel MOS transistor P12 has a high resistance.

In the SRAM according to the present invention, the voltage of the node that holds the data "0" (the low level) is not only increased by only the charges charged in the bit line capacitor, but also raised by any voltage (biased). For this reason, the SNM of the SRAM in the abnormal state that cannot be detected (cannot be removed) by the read test based on the conventional technique can be further reduced, thereby improving the detection sensibility.

Also, the changes in the SRAM according to the present invention from the conventional technique shown in FIG. 1 are only the operation of the pre-charge control circuit in the test mode (the pre-charge control signal between the times T2 and T3) and the pre-charge control signal PRB1 for controlling the pre-charging circuit 20. For this reason, without changing the memory cell and the pre-charging circuit, it is possible to carry out the test that can detect the memory cell in the abnormal state in which SNM is small. That is, according to the present invention, by changing the pre-charge control circuit 30, it is possible to improve the abnormality detection sensibility of the SRAM without increasing the circuit area.

Moreover, in the SRAM according to the present invention, the pull-up performance of the storage node in the memory cell 10 is controlled based on the voltage that can be arbitrarily set from the pre-charging circuit 20. For this reason, the SNM reduction rate of the memory cell 10 can be set to a proper value. Accordingly, the condition (the margin) of the read test (the SNM test) can be made strict or gentle and consequently changed to the desirable condition.

Figure 7:
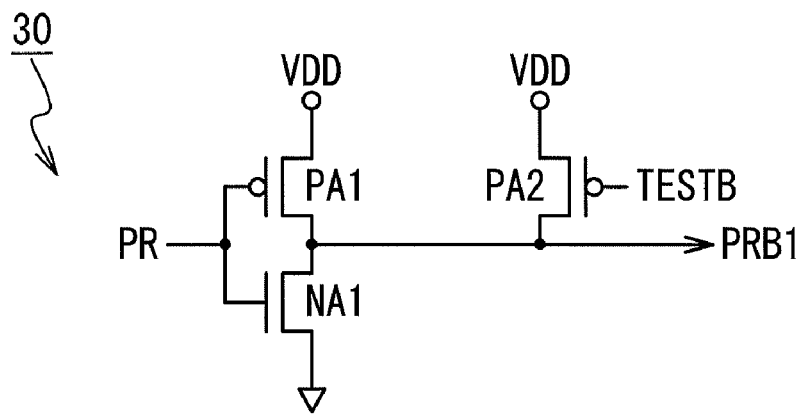
FIG. 7 is a circuit diagram showing a configuration of a pre-charge control circuit according to the present invention.
Figure 8:
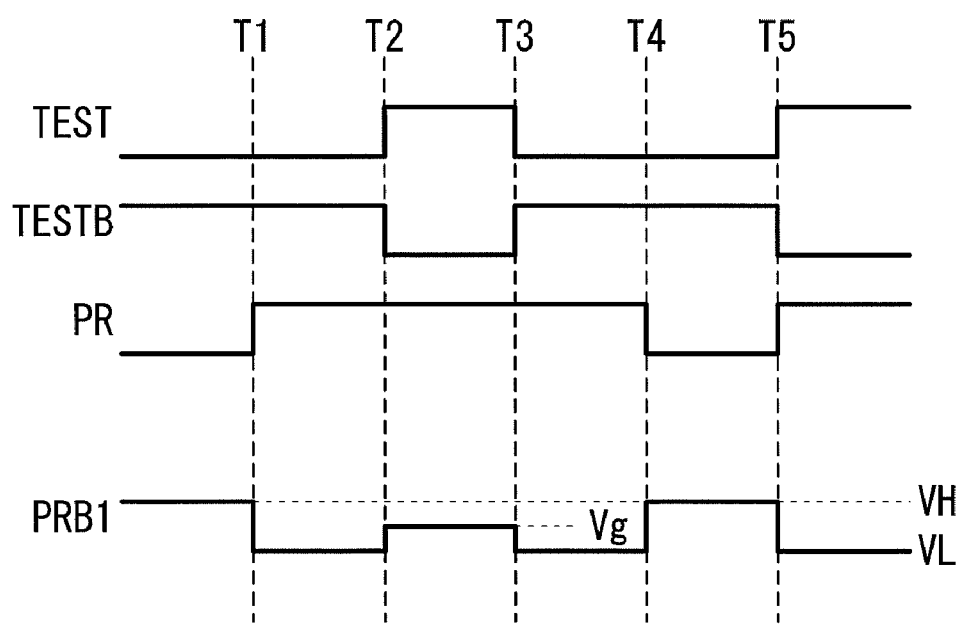
FIG. 8 shows timing charts in a read test operation of the pre-charge control circuit.

One example of the pre-charge control circuit 30 according to the present invention will be described below with reference to FIGS. 7 and 8. FIG. 7 is a circuit diagram showing one example of the configuration of the pre-charge control circuit 30. FIG. 8 shows timing charts in the read test in the pre-charge control circuit 30. With reference to FIG. 7, the pre-charge control circuit 30 contains an inverter for receiving a pre-charge control signal PR and outputting the pre-charge control signal PRB1; and a P-channel MOS transistor PA2 for pulling up the pre-charge control signal PRB1 on the basis of a test signal TESTB. The inverter contains a P-channel MOS transistor PA1 and an N-channel MOS transistor NA1. The inverter is connected between the first power supply voltage (VDD) and the second power supply voltage (GND). The test signal TESTB is supplied to the gate of the P-channel MOS transistor PA2, and its source is connected to the first power supply (VDD), and its drain is connected to the output of the inverter.

The operation of the read test in the pre-charge control circuit 30 shown in FIG. 7 will be described below with reference to FIG. 8. A period between the times T1 and T5 shown in FIG. 8 corresponds to a period between the times T1 and T5 shown in FIG. 6. Of the period between the times T1 and T5, in the period other than a period for the SNM reduction process (between the times T2 and T3), the test signal TESTB is set to the high level, and the pre-charge control circuit 30 outputs the inverter output (the high level VH "1" or the low level VL "0") based on the signal level of the pre-charge control signal as the pre-charge control signal PRB1, similarly to the ordinary mode.

On the other hand, in the SNM reduction process period (between the times T2 and T3), the pre-charge control signal of the high level and the test signal TESTB of the low level are set for the pre-charge control circuit 30. In this state, both of the P-channel MOS transistor PA2 and the N-channel MOS transistor NA1 are turned on. Thus, the signal level (the voltage Vg) of the pre-charge control signal B1 is determined on the basis of the on-resistance ratio between both the transistors. For this reason, by changing the on-resistances of the P-channel MOS transistor PA2 and the N-channel MOS transistor NA1, it is possible to arbitrarily set the voltage Vg of the pre-charge control signal PRB1.

Figure 9:
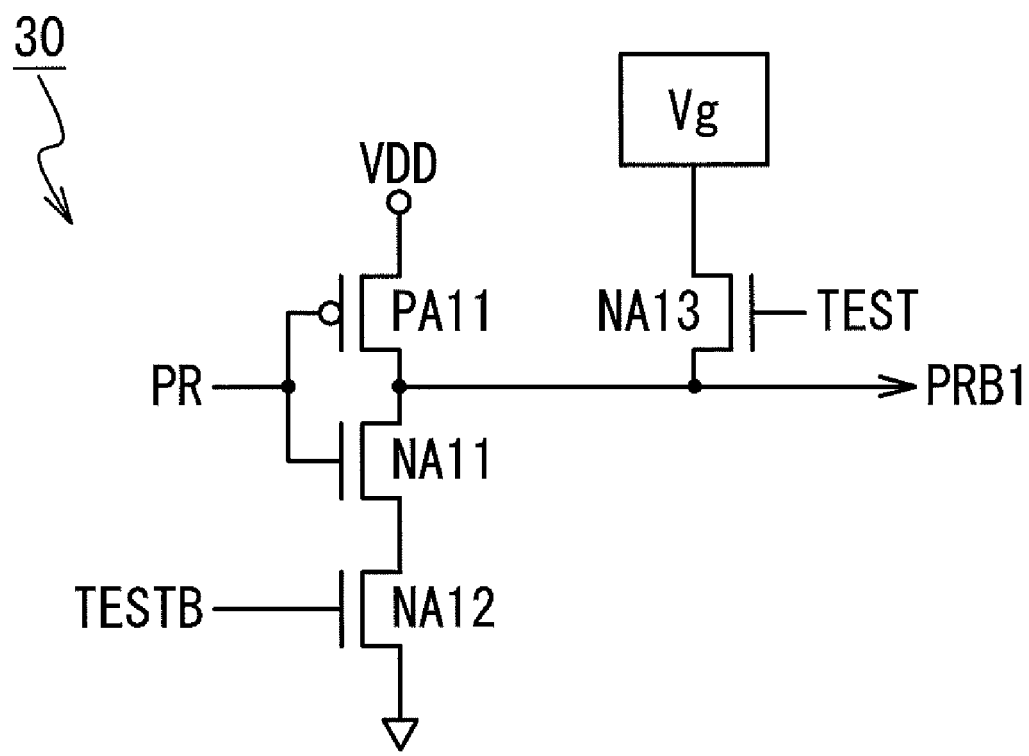
FIG. 9 is a circuit diagram showing the configuration of the pre-charge control circuit according to the present invention.

FIG. 9 is a circuit diagram showing another example of the configuration of the pre-charge control circuit 30. With reference to FIG. 9, the pre-charge control circuit 30 contains an inverter for receiving the pre-charge control signal and outputting the pre-charge control signal PRB1, and an N-channel MOS transistor NA13 for pulling up the pre-charge control signal PRB1 to the voltage Vg on the basis of a test signal TEST. The inverter contains a P-channel MOS transistor PA11 and an N-channel MOS transistor NA11. The inverter is connected between the first power supply voltage (VDD) and the second power supply voltage (GND). In detail, the source of the N-channel MOS transistor NA11 is grounded through an N-channel MOS transistor NA12. The N-channel MOS transistor NA12 controls the connection between the inverter and the second power supply voltage (GND) on the basis of the test signal TESTB supplied to the gate. The test signal TEST is supplied to the gate of the N-channel MOS transistor NA13, and the drain is connected to the power supply (Vg), and the source is connected to the output of the inverter.

The operation of the read test in the pre-charge control circuit 30 shown in FIG. 9 will be described below with reference to FIG. 8. The period between the times T1 and T5 shown in FIG. 8 corresponds to the period between the times T1 and T5 shown in FIG. 6. Of the period between the times T1 and T5, in the period except a period for the SNM reduction process (the period between the times T2 and T3), the test signal TESTB is set to the high level, and the pre-charge control circuit 30 outputs the inverter output (the high level VH "1" or the low level VL "0") based on the signal level of the pre-charge control signal, as the pre-charge control signal PRB1, similarly to the ordinary mode.

In the SNM reduction process period (between the times T2 and T3), the pre-charge control signal of the high level, the test signal TEST of the high level and the test signal TESTB of the low level are set for the pre-charge control circuit 30. In this state, both of the P-channel MOS transistor PA11 and the N-channel MOS transistor NA12 are turned off, and the voltage Vg applied to the drain of the N-channel MOS transistor NA13 is outputted as the pre-charge control signal PRB1. It should be noted that the voltage Vg can be easily set to any level by receiving from the testing circuit, or carrying out a voltage drop inside a chip, or performing a resistor division on the first power supply voltage VDD. For example, the signal level (the voltage Vg) of the pre-charge control signal PRB1 is set, in such a way that the held data by the memory cell 10, SNM of which is smaller than a predetermined value is inverted.

As mentioned above, in the SRAM in this embodiment, the pre-charge control signal PRB1 set to any voltage Vg is used to control the pull-up performance of the data holding node in the memory cell 10. Thus, the SNM of the memory cell 10 can be set to a proper value. That is, according to the present invention, the easiness of the inversion of the data held by the memory cell 10 is set to a desirable level. Thus, it is possible to carry out the read SNM test corresponding to the SNM value of a memory cell targeted for a rejection and the test condition. Therefore, according to the present invention, it is possible to reserve a high yield while attaining the high quality.

Second Embodiment

Figure 10:
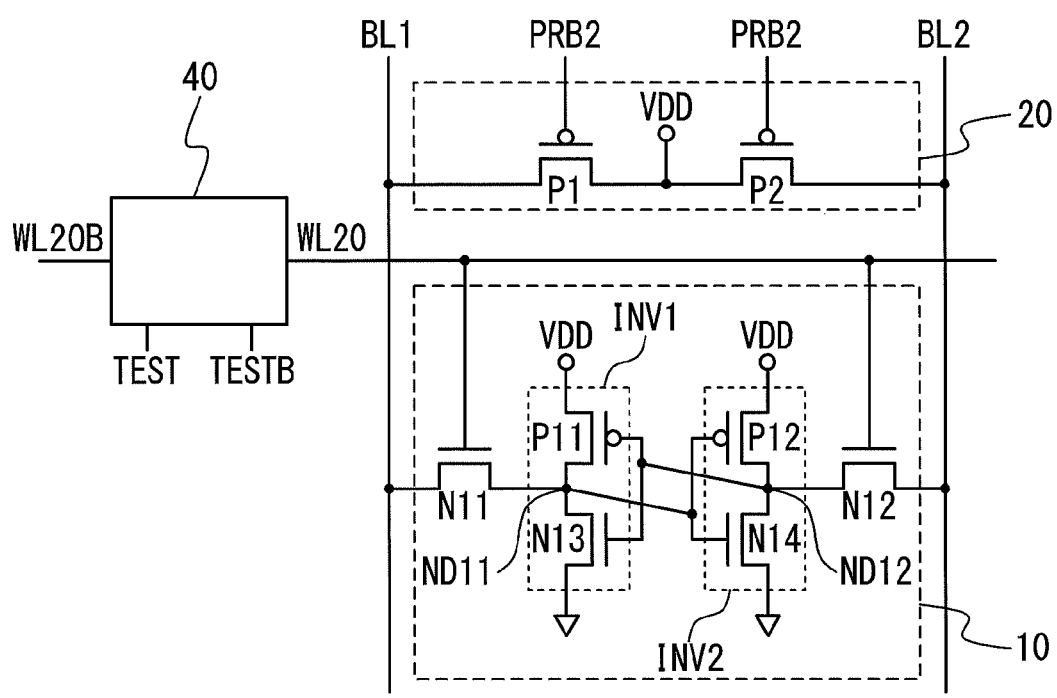
FIG. 10 is a circuit diagram showing the configuration of the SRAM according to a second embodiment of the present invention.

The SRAM according to a second embodiment of the present invention and the read test method of the SRAM will be described below with reference to FIGS. 10 to 13A. FIG. 10 is a circuit diagram showing a part of the configuration of the SRAM in the second embodiment. In the SRAM in the first embodiment, in the test mode, the pre-charging circuit 20 is controlled by changing the signal level of a pre-charge control signal PB1 to any value (the voltage Vg). Accordingly, a predetermined voltage between the high level and the low level is biased to the bit lines BL1 and BL2, and the data of the memory cell whose SNM is small is forcedly inverted. Thus, it is made possible to detect the memory cell in the abnormal state that cannot be usually rejected. On the other hand, in the SRAM in the second embodiment, in the test mode, the signal level of the selection signal outputted to the word line is changed to any value to control the pull-up performance of the holding node in the memory cell. Therefore, the data of the memory cell whose SNM is small is forcedly inverted, which makes it possible to detect the memory cell in the abnormal state that cannot be usually rejected.

The configuration of the SRAM in the second embodiment will be described below with reference to FIG. 10. Here, the similar symbols are assigned to the configurations similar to those of the first embodiment, and their explanations are omitted. The SRAM in the second embodiment contains the memory cell 10, the pre-charging circuit 20 and a word line control circuit 40. The memory cell 10 in the second embodiment is connected to a word line WL20, and the pre-charging circuit 20 pre-charges the bit lines BL1 and BL2 on the basis of a pre-charge control signal PRB2 that is controlled at the signal level similar to the conventional technique. In addition, the configurations of the memory cell 10 and the pre-charging circuit 20 are similar to those of the first embodiment.

The word line WL20 in the second embodiment is driven by the word line control circuit 40. The word line control circuit 40 supplies a voltage of a signal level corresponding to a selection signal WL20B for selecting the memory cell, to the word line WL20. In the ordinary mode, the word line control circuit 40 outputs to the word line WL20, the selection signal of by inverting the selection signal WL20B, in which the test signal TEST of the low level and the test signal TESTB of the high level are set. In the test mode, the test signal TEST of the high level and the test signal TESTB of the low level are set at predetermined timings, and the selection signal of a predetermined voltage VW is outputted to the word line WL20.

Figure 11:
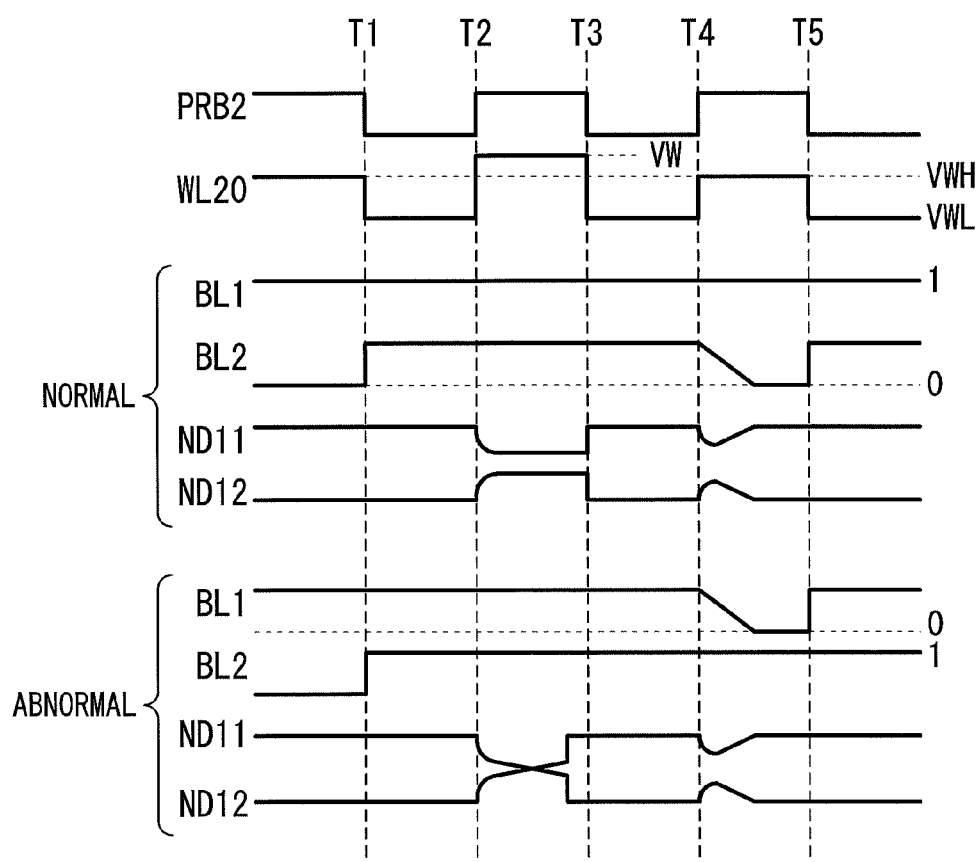
FIG. 11 shows timing charts in a read test of the SRAM in the second embodiment.

The detail of the operation of the SRAM in the second embodiment in the test mode will be described below with reference to FIG. 11. FIG. 11 shows timing charts in the read test for the SRAM in the second embodiment.

The test operation in this embodiment differs from that of the first embodiment in the operation in the period between the times T2 and T3, and the operation in the remaining period is similar. Thus, only the operation between the times T2 and T3 is described, and the explanation of the operation in the remaining period is omitted.

At the time T2, the pre-charge control signal PRB2 is changed to the high level, and the word line WL20 is activated. At this time, the word line control circuit 40 activates the word line WL20 to a voltage VW higher than the usual high level (VHW=VDD). Thus, the gates of the selection transistors N11 and N12 are set to the voltage VW higher than the power supply voltage VDD, and the on-resistance of the selection transistor N12 is largely decreased, as compared with in the ordinary mode. As this result, the voltage of the node ND12 is increased to a high voltage, as compared with the read in the ordinary mode.

In this embodiment, since the activation level of the word line WL20 is made higher than the usual high level (VHW=VDD), the voltage of the node ND12 is increased from the low level "0" by the predetermined voltage, and the voltage of the node ND11 is decreased from the high level "1" by the predetermined voltage. Consequently, the voltage of the node ND12 that holds the low level "0" is easily increased, as compared with the ordinary mode, and easily exceeds the logical threshold voltage of the inverter INV1. Or, the voltage of the node ND11 that holds the high level "1" is easily decreased, as compared with the ordinary mode, and easily falls below the logical threshold voltage of the inverter INV2. That is, in this embodiment, since the word line WL20 is set to any voltage VW, the resistance of the selection transistor N12 can be controlled to any value, to reduce the SNM of the memory cell 10, which leads to the state in which the data held by the memory cell 10 is easily inverted.

In the present invention, after the bit lines BL1 and BL2 are pre-charged, the signal level of the word line WL20 is set to any voltage VW. Thus, the on-resistances of the selection transistors N11 and N12 can be controlled to any values. Consequently, a disturbance of any level can be applied on the memory cell 10. That is, the reduction rate of the SNM of the memory cell 10 can be arbitrarily changed by the word line control circuit 40. For example, when the reduction rate of the SNM is made high (in a case of a large disturbance), the charge-up performance of the node ND12 that holds the low level "0" is increased, which largely increases the voltage of the node ND12. On the contrary, when the reduction rate of the SNM is made low (in a case of a small disturbance), the charge-up performance of the node ND12 that holds the low level "0" is decreased, which decreases an increasing amount in the voltage of the node ND12.

Similarly to the first embodiment, when the memory cell 10 is in the normal state, the value of the voltage Vg is set such that the data written in the memory cell 10 is not inverted, even if the word line WL20 is activated (disturbed) to the voltage VW. Also, in a case of the memory cell in which the SNM is small and the defect generation rate is high, the voltage VW is set such that the data held at the nodes ND11 and ND12 are inverted. By changing the voltage VW, it is possible to change the detection sensibility of the memory cell in the abnormal state. That is, according to the SRAM in this embodiment, the detection sensibility of the memory cell in the abnormal state can be changed on the basis of the specification and design condition of the circuit.

Also, the change item between the SRAM according to the present invention and the conventional technique shown in FIG. 1 lies in that the transistor for changing the voltage is added to the usual word line control circuit for activating the word line WL20. For this reason, without changing the memory cell and the pre-charging circuit, it is possible to carry out the test that can detect the memory cell in the abnormal state whose SNM is small. That is, according to the present invention, by changing the word line control circuit, it is possible to improve the abnormality detection sensibility of the SRAM without increasing the circuit area.

Moreover, in the SRAM according to the present invention, since the word line WL20 is activated to the arbitrarily settable voltage VW, the on-resistances of the selection transistors N11 and N12 are controlled to control the pull-up performance of the storage node in the memory cell 10. For this reason, the SNM reduction rate of the memory cell 10 can be set to a proper value. Consequently, the condition (the margin) of the read test (the SNM test) can be made strict or gentle and changed to a desirable condition.

Figure 12:
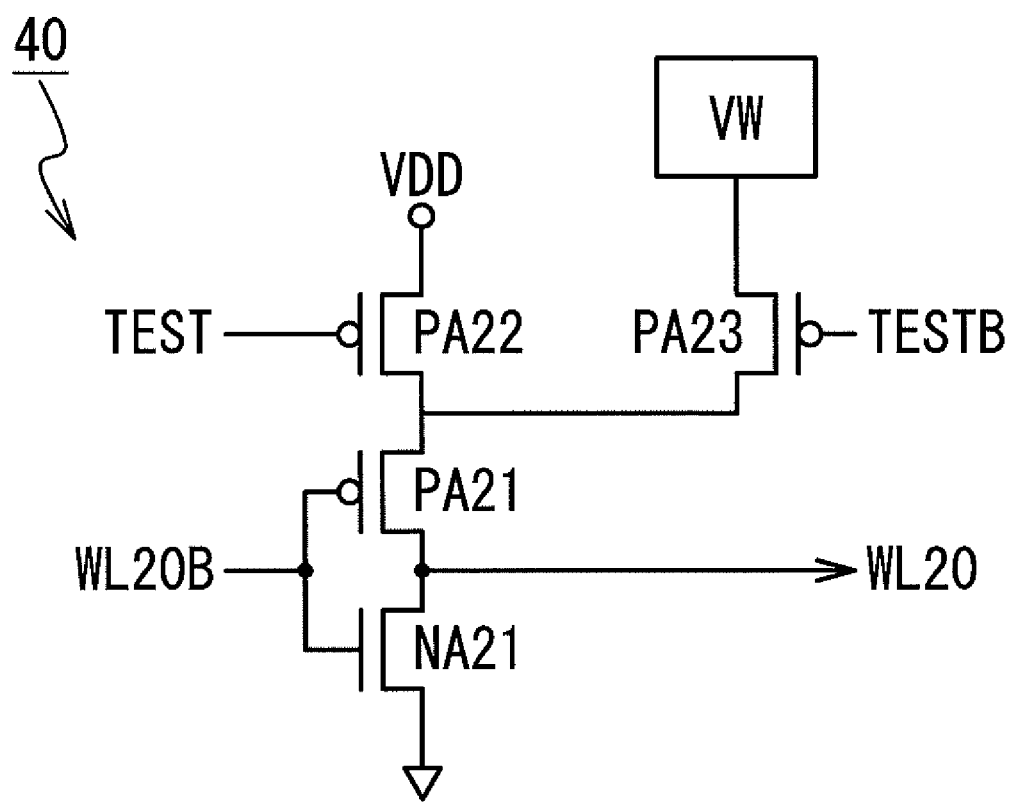
FIG. 12 is a circuit diagram showing the configuration of a word line control circuit according to the present invention.
Figure 13:
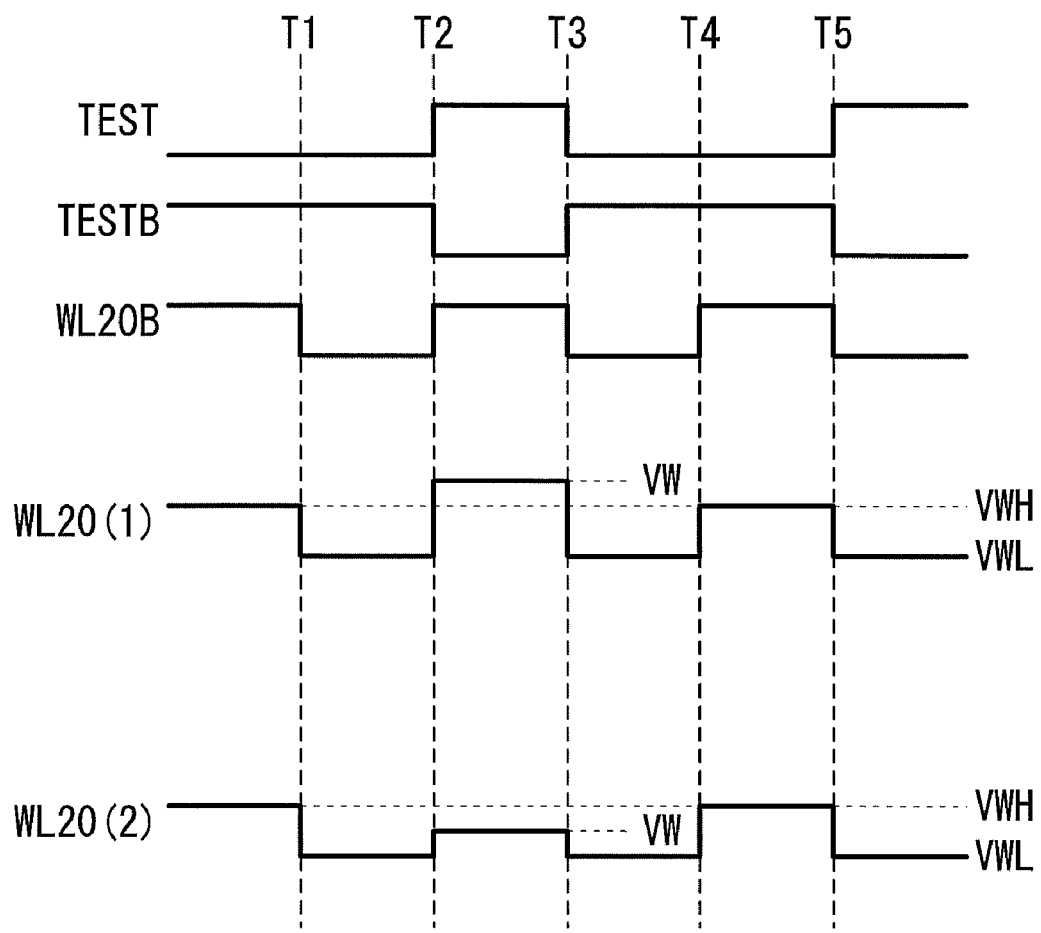
FIG. 13 shows timing charts in a read test operation of the word line control circuit according to the present invention.

One example of the word line control circuit 40 according to the present invention will be described below with reference to FIGS. 12 and 13. FIG. 12 is a circuit diagram showing one example of the configuration of the word line control circuit 40. FIG. 13 shows timing charts in the operation of the read test of the word line control circuit 40.

With reference to FIG. 12, the word line control circuit 40 contains an inverter for outputting an inversion signal of the selection signal WL20B as the selection signal WL20 to the word line WL20, a P-channel MOS transistor PA22 for supplying the first power supply voltage VDD to the inverter on the basis of the test signal TEST, and a P-channel MOS transistor PA23 for supplying the voltage VW to the inverter on the basis of the test signal TESTB (the inversion signal of the test signal TESTB). The inverter contains a P-channel MOS transistor PA21 and an N-channel MOS transistor NA21. The source of the P-channel MOS transistor PA21 is connected to the drains of the P-channel MOS transistors PA22 and PA23, and the source of the N-channel MOS transistor NA21 is connected to the second power supply voltage (GND). In such configuration, the power supply voltage supplied to the inverter is switched to one of the first power supply voltage VDD and the voltage VW in accordance with the test signals TEST and TESTB.

The operation of the word line control circuit 40 shown in FIG. 12 in the read test will be described below with reference to FIG. 13. The period between the times T1 and T5 shown in FIG. 13 corresponds to the period between the times T1 and T5 shown in FIG. 11. In the period except the SNM reduction process period (between the times T2 and T3) of the period between the times T1 and T5, the test signal TEST is set to the low level, and the test signal TESTB is set to the high level. Then, the word line control circuit 40 outputs the inverter output corresponding to the signal level of the selection signal WL (the high level VWH "VDD" or the low level VWL "0") to the word line WL20(1), similarly to the ordinary mode.

On the other hand, in the SNM reduction process period (between the times T2 and T3), the test signal TEST of the high level (the test signal TESTB of the low level) is set to the word line control circuit 40. In this state, the P-channel MOS transistor PA21 is turned on, and the P-channel MOS transistor PA22 is turned off, and the word line WL20(1) and the first power supply (VDD) are separated, and the voltage VW is applied to the word line WL20(1). It should be noted that the voltage VW is possible to easily set to any level by receiving from a test terminal or boosting the voltage high inside the chip. For example, the signal level (VW) to which the word line WL20 is activated is set in such a way that the held data by the memory cell 10 whose SNM is smaller than the predetermined value is inverted.

As mentioned above, in the SRAM in this embodiment, the word line WL20 set to any voltage VW is used to control the pull-up performance of the data holding node in the memory cell 10. Thus, the SNM of the memory cell 10 can be set to a proper value. That is, according to the present invention, the easiness of the inversion of the data held by the memory cell 10 is set to a desirable level. Thus, it is possible to carry out the read SNM test corresponding to the SNM value of the memory cell targeted for the rejection and the test condition. Therefore, according to the present invention, it is possible to reserve a high yield while attaining the high quality.

The first embodiment and the second embodiment can be combined in a range that no inconsistence from the technical aspect is present. In this case, in the SNM reduction process period (between the times T2 and T3), the pre-charging circuit 20 is controlled, and the predetermined voltage is supplied to the bit lines BL1 and BL2, and the voltage VW is applied to a word line b. Consequently, the SNM of the memory cell can be largely reduced, as compared with the first and second embodiments.

In the SRAM in the second embodiment, since the voltage VW to activate the word line WL20 is set to a value higher than the high level in the ordinary mode (VWH=VDD), the memory cell in the abnormal state whose SNM is small can be detected even in a write test.

Figure 14:
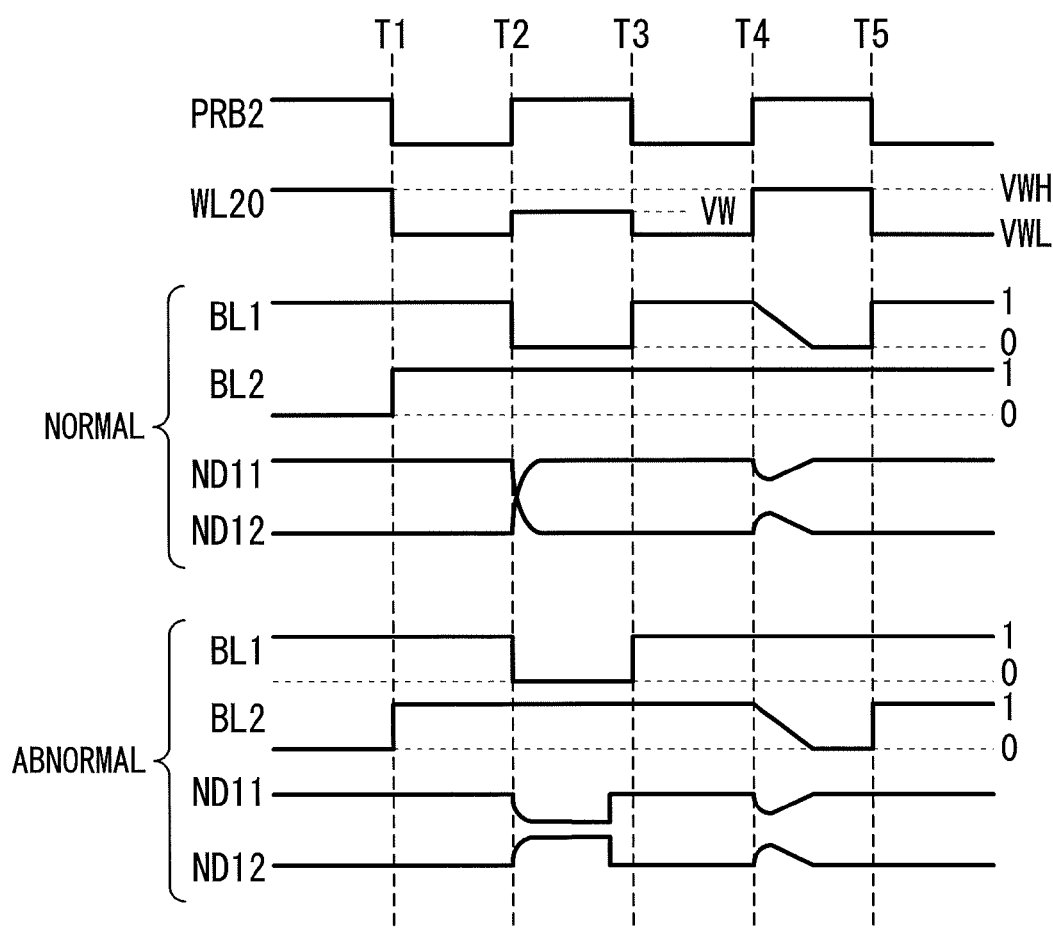
FIG. 14 shows timing charts in a write test of the SRAM in the second embodiment.

The detail of the operation of the write test of the SRAM in the second embodiment will be described below with reference to FIGS. 13 and 14. FIG. 13 shows the timing charts in the write test operation of the word line control circuit 40 according to the present invention. FIG. 14 shows timing charts in the write test operation for the SRAM in the second embodiment.

In the write test mode, a write of a data (until a time T1), a pre-charging operation of the bit lines (between the times T1 and T2), the write margin reduction process and the write of the data (between the times T2 and T3), the pre-charging of the bit lines (between the times T3 and T4), a read of the data (between the times T4 and T5), and the determination of whether or not to be in the abnormal state (after the time T5) are carried out.

At first, until the time T1, the word line WL20 is activated, and "1" (the high level) is written to the node ND11, and "0" (the low level) is written to the node ND12. At this time, the pre-charging circuit 20 disconnects the connection between the first power supply voltage VDD and each of the bit lines BL1 and BL2 on the basis of the pre-charge control signal PRB2 of the high level, similarly to the ordinary mode. At the time T1, the pre-charge control signal PRB1 is changed to the low level (VL), and the word line WL20 (WL20(2) in FIG. 13) is inactivated. Consequently, the memory cell 10 is separated from the bit lines BL1 and BL2, and the bit lines BL1 and BL2 are pre-charged to the high level by the pre-charging circuit 20.

Between the times T2 and T3, the pre-charge control signal PRB2 is changed to the high level, and the word line WL20 (WL20(2) in FIG. 13) is activated, and the inversion data of the data held by the memory cell 10 is written to the memory cell 10. Here, "0" (the low level) is written to the node ND11, and "1" (the high level) is written to the node ND12. At this time, the word line control circuit 40 activates the word line WL20 to the voltage VW lower than the usual high level (VHW=VDD). Consequently, the gates of the selection transistors N11 and N12 are set to the voltage VW lower than the power supply voltage VDD, and the on-resistances of the selection transistors N11 and N12 become greater than those of the usual case. As this result, the voltage of the node ND11 keeps a voltage higher than that of the write in the ordinary mode. The voltage of the node ND12 is increased to a voltage lower than that of the write in the ordinary mode.

In this embodiment, since the activation level of the word line WL20 is made lower than the usual high level (VHW=VDD), the pull-up performance of the node in the memory cell 10 is controlled, thereby reducing a write margin of the memory cell 10. Consequently, the held data is inverted, which can lead to the state shown on the drawing, namely, the state in which it is difficult to write the inversion data of the held data into the memory cell 10. For example, it is difficult to increase the voltage of the node ND12 that holds the low level "0", as compared with the ordinary mode, and it is difficult that the voltage of the node ND12 exceeds the logical threshold voltage of the inverter INV1. Or, it is difficult to decrease the voltage of the node ND11 that holds the high level "1", as compared with the ordinary mode, and it is difficult that the voltage of the node ND11 falls below the logical threshold voltage of the inverter INV2.

Here, when the memory cell 10 is in the normal state, the signal levels of the nodes ND11 and ND12 are inverted on the basis of the write data, even if the word line WL20 is activated (disturbed) to the voltage VW. That is, when the memory cell 10 is in the normal state, the data set to the bit lines BL1 and BL2 are correctly written to the memory cell 10. On the other hand, in a case of the memory cell in which the SNM is small and the defect generation rate is high, the voltages of the nodes ND11 and ND12 do not exceed the threshold voltages of the inverters INV1 and INV2, respectively. Thus, the held data is not inverted. That is, in the case of the memory cell in the abnormal state, the data set to the bit lines BL1 and BL2 are not written to the memory cell 10.

Between the times T3 and T4, the pre-charging process is carried out for a read process. In detail, the pre-charge control signal PRB2 is changed to the low level (VL), and the word line WL20 is inactivated. Consequently, the pre-charging circuit 20 pre-charges the bit lines BL1 and BL2 to the high level. In succession, between the times T4 and T5, the data is read from the memory cell 10. Here, the pre-charge control signal PRB1 is changed to the high level (VH), and the word line WL20 is activated. Consequently, the first power supply voltage VDD and the bit lines BL1 and BL2 are separated. Then, the data is read from the memory cell 10.

If the data read from the memory cell 10 between the times T4 and T5 and the data written between the times T2 and T3 are coincident, the memory cell 10 is determined to be in the normal state, and if both are different, the memory cell 10 is determined to be in the abnormal state.

In the SRAM according to this embodiment, when the data is written, the voltage VW to which the word line WL20 is activated is set to be lower than the activation level of the usual word line. Thus, the setting can be carried out such that the write margin of the memory cell 10 is reduced and the write of the inversion data is made difficult. In the write test mode, the voltage VW is set to a proper value lower than the power supply voltage VDD. Thus, a disturbance is applied on the memory cell 10, and the control is carried out such that the inversion data cannot be written to the memory cell in the abnormal state whose SNM is small, and the memory cell can be detected as the memory cell in the abnormal state. With reference to FIG. 13, the word line control circuit 40 can activate the word line WL20 to a voltage lower than the power supply voltage VDD on the basis of the supplied voltage VW, similarly to the read test mode. Since the voltage VW can be set to any value lower than the power supply voltage VDD, the detection sensibility of the memory cell in the abnormal state can be changed even in the write test. For example, the signal level (the voltage VW) to which the word line WL20 is activated is set so as to invert the held data by the memory cell 10 whose SNM is smaller than the predetermined value. Thus, according to the SRAM in this embodiment, the detection sensibility of the memory cell in the abnormal state for the write can be changed on the basis of the specification of the circuit and a design condition.

As mentioned above, according to the SRAM in this embodiment, the detection sensibility of the memory cell in the abnormal state can be improved not only in the read test but also in the write test.

Third Embodiment

The third embodiment of the SRAM according to the present invention and the read test method of the SRAM will be described below with reference to FIGS. 15 to 18.

Figure 15:
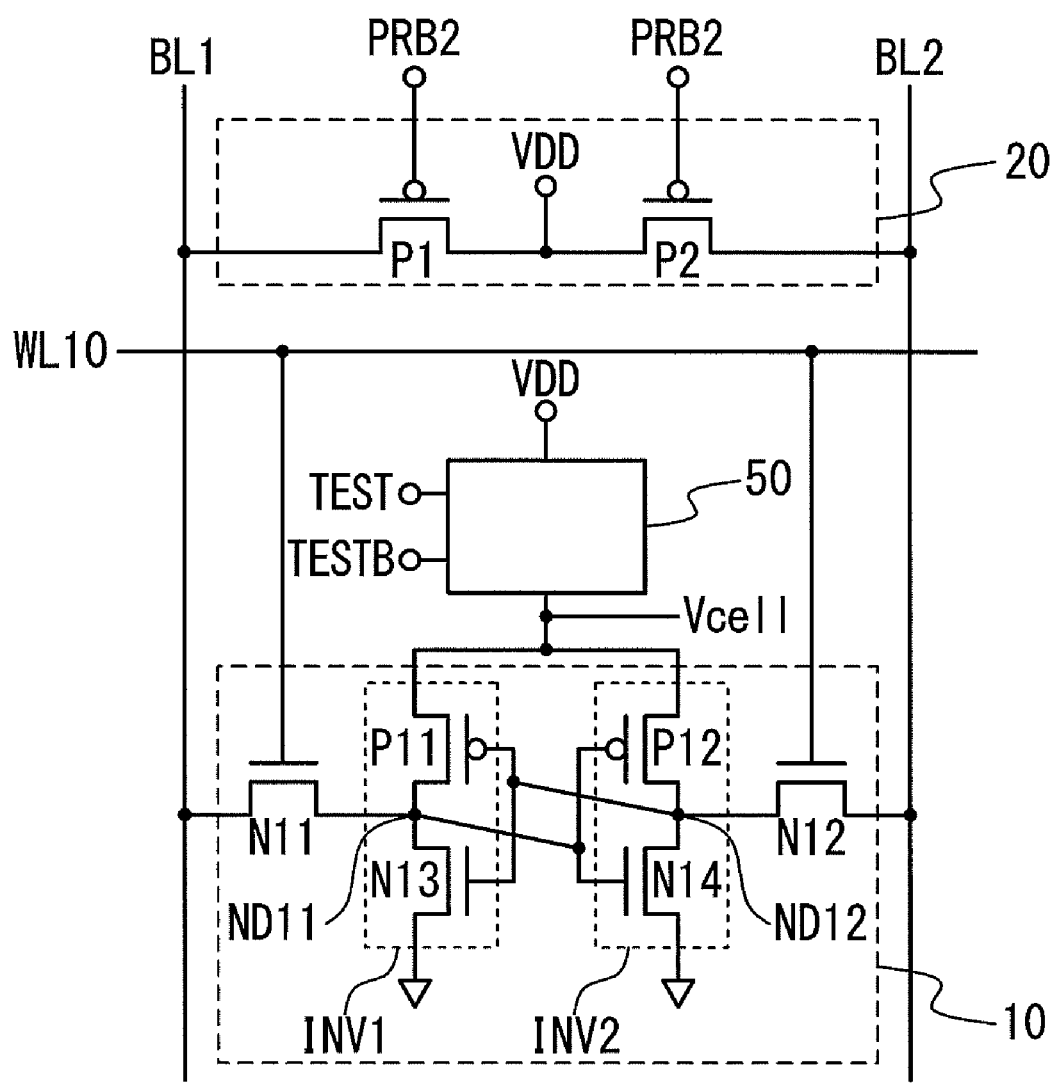
FIG. 15 is a circuit diagram showing the configuration of the SRAM according to a third embodiment of the present invention.

FIG. 15 is a circuit diagram showing a part of the configuration of the SRAM in the third embodiment. In the SRAM in the third embodiment, the power supply voltage supplied to the memory cell is changed to any value in the test mode, to control the pull-up performance of the holding node in the memory cell. Consequently, the data of the memory cell whose SNM is small is forcedly inverted, which allows the detection of the memory cell in the abnormal state that cannot be usually rejected.

The configuration of the SRAM in the third embodiment will be described below with reference to FIG. 15. Here, the same symbols are assigned to the same components in the first embodiment, and their explanations are omitted. The SRAM in the third embodiment contains the memory cell 10, the pre-charging circuit 20 and a power supply control circuit 50. The pre-charging circuit 20 in the third embodiment pre-charges the bit lines BL1 and BL2 on the basis of the pre-charge control signal PRB2 that is controlled to the signal level similar to that of the conventional technique. In addition, the configurations of the memory cell 10 and the pre-charging circuit 20 are similar to those of the first embodiment.

The memory cell 10 in the third embodiment is driven with a power supply voltage Vcell supplied by the power supply control circuit 50. In detail, the sources of the P-channel MOS transistors P11 and P12 are connected to the power supply control circuit 50. The power supply control circuit 50 changes the first power supply voltage VDD on the basis of the test signals TEST and TESTB and supplies it as the power supply voltage Vcell to the memory cell 10.

In the ordinary mode, in the power supply control circuit 50, the test signal TEST of the low level and the test signal TESTB of the high level are set, and the first power supply voltage VDD is supplied to the memory cell 10 as the power supply voltage Vcell. In the test mode, the test signal TEST of the high level, and the test signal TESTB of the low level are set at predetermined timings, and the power supply voltage Vcell(1) of a predetermined voltage Vc is supplied to the memory cell 10.

Figure 16:
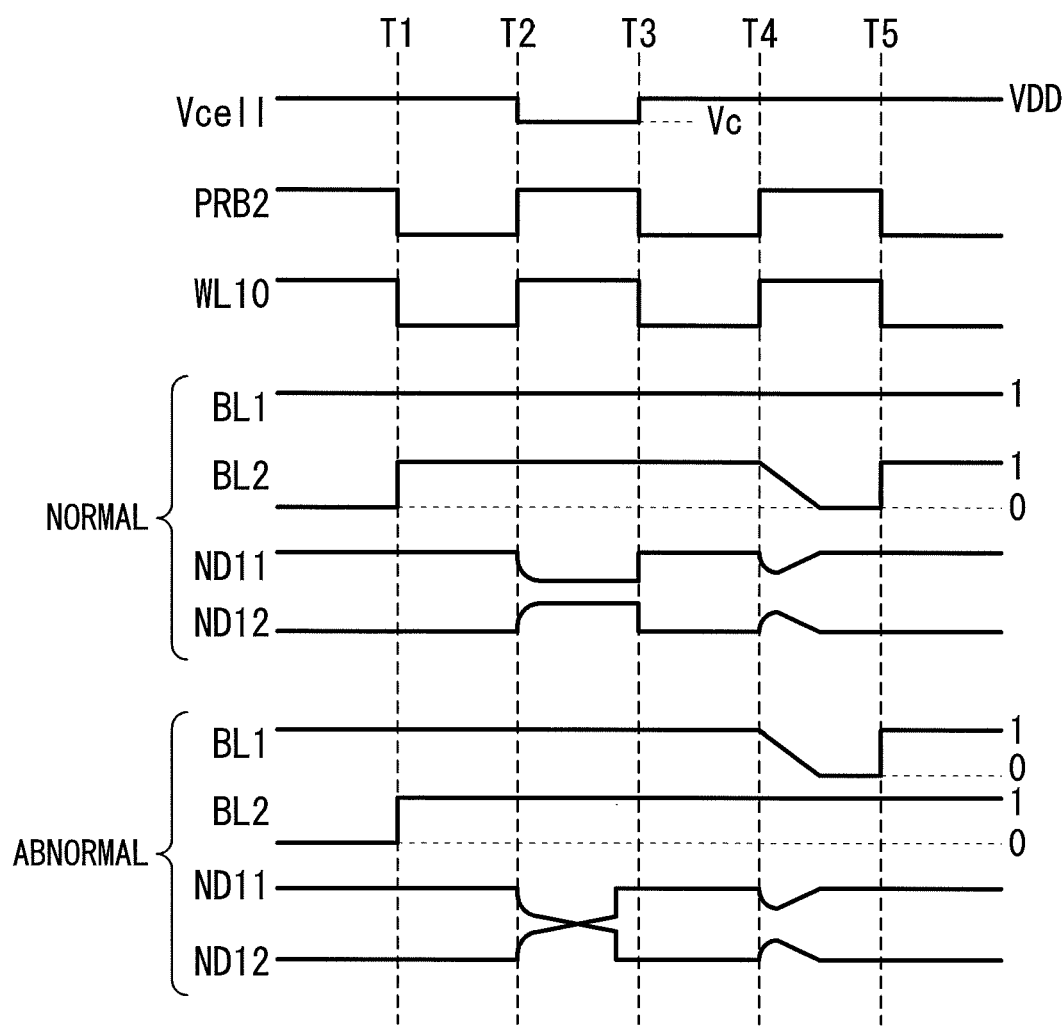
FIG. 16 shows timing charts in the read test of the SRAM in the third embodiment.

The detail of the operation of the third embodiment of the SRAM in the test mode will be described below with reference to FIG. 16. FIG. 16 shows timing charts in the read test operation for the SRAM in the third embodiment.

The test operation in this embodiment differs from the first embodiment in only the operation in a period between the times T2 and T3, and the operation in the other period is similar. Thus, hereinafter, only the operation in the period between the times T2 and T3 will be described, and the description of the operation of the other period is omitted.

At the time T2, the pre-charge control signal PRB2 is changed to the high level, and the word line WL10 is activated. At this time, the power supply control circuit 50 supplies the power supply voltage Vcell (Vcell(2) in FIG. 18) with a voltage value Vc, which is lower than the first power supply voltage VDD, to the memory cell 10. Consequently, the load resistance (the on-resistances of the P-channel MOS transistors P11 and P12) becomes higher than the usual case. Thus, the logical threshold voltage of the inverter INV1 that holds the high level data "1" is decreased. This results in a state in which the voltage of the node ND12 easily exceeds the logical threshold voltage of the inverter INV1. That is, by decreasing the power supply voltage of the memory cell 10, it is possible to reduce the SNM of the memory cell 10 and attain the state in which the held data is easily inverted.

In the present invention, after the bit lines BL1 and BL2 are pre-charged, the power supply voltage Vcell is set to any voltage Vc. Thus, the threshold voltage of the inverter in the memory cell 10 can be controlled to any value. Therefore, a disturbance can be applied to the memory cell 10. That is, the reduction rate of the SNM of the memory cell 10 can be arbitrarily changed by the power supply control circuit 50. For example, when the reduction rate of the SNM is increased (a large disturbance is applied), the threshold voltage of the inverter INV1 that holds the low level "0" is largely decreased. On the contrary, when the reduction rate of the SNM is decreased (a small disturbance is applied), the reduction rate of the threshold voltage of the inverter INV1 that holds the low level 0 is suppressed.

Similarly to the first embodiment, when the memory cell 10 is in the normal state, the value of the voltage Vc is set in such a manner that the data written in the memory cell 10 is inverted, even if the value of the power supply voltage Vcell is changed (disturbed). Also, in a case of the memory cell in which the SNM is small and the defect generation rate is high, the value of the voltage Vc is set in such a manner that the data held at the nodes ND11 and ND12 are inverted. By changing the voltage Vc, it is possible to change the detection sensibility of the memory cell in the abnormal state. That is, according to the SRAM in this embodiment, the detection sensibility of the memory cell in the abnormal state can be changed on the basis of the specification of the circuit and a design condition.

Also, the difference between the SRAM according to the present invention and the conventional technique shown in FIG. 1 lies in only the addition of the power supply control circuit 50 for controlling the power supply voltage. For this reason, without changing the memory cell and the pre-charging circuit, it is possible to carry out the test that can detect the memory cell in the abnormal state whose SNM is small. That is, according to the present invention, it is possible to improve the abnormality detection sensibility of the SRAM without largely increasing the circuit area.

Moreover, in the SRAM according to the present invention, the power supply voltage Vcell is arbitrarily changed to decrease the threshold voltage of the inverter in the memory cell 10 in the read test. For this reason, the SNM reduction rate of the memory cell 10 can be set to a proper value. Consequently, the condition (the margin) of the read test (the SNM test) can be made strict or gentle and changed to a desirable condition.

Figure 17:
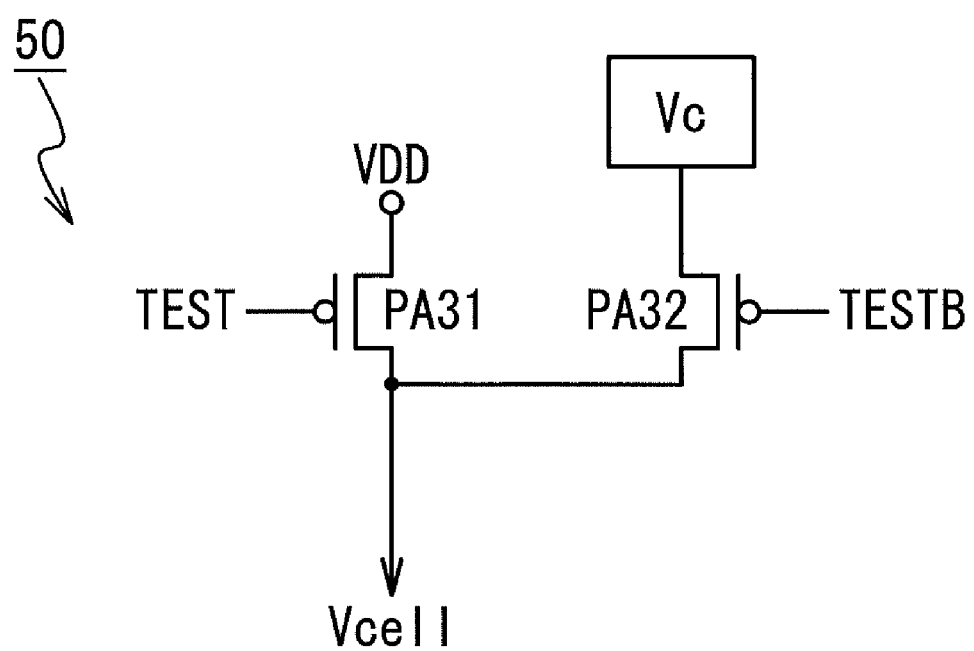
FIG. 17 is a circuit diagram showing the configuration of a power supply control circuit according to the present invention.
Figure 18:
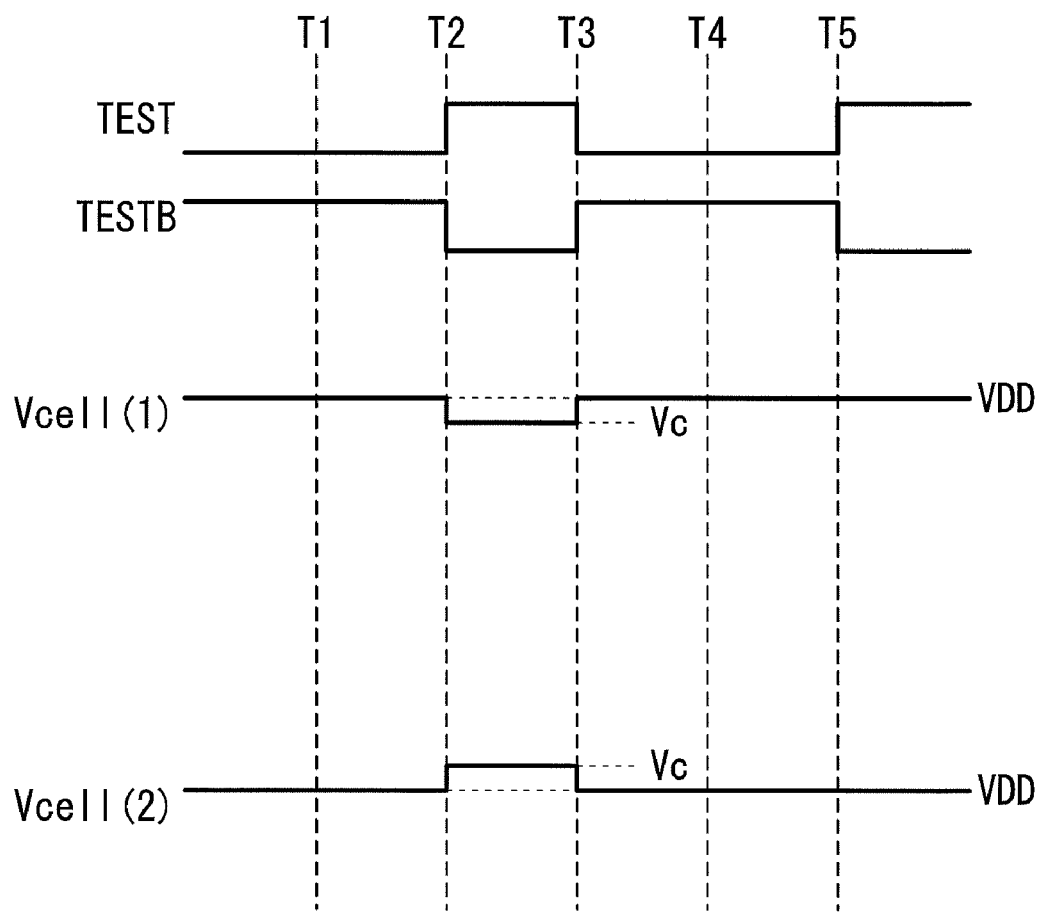
FIG. 18 shows timing charts of the power supply control circuit in a test mode.

One example of the power supply control circuit 50 according to the present invention will be described below with reference to FIGS. 17 and 18. FIG. 17 is a circuit diagram showing one example of the configuration of the power supply control circuit 50. FIG. 18 shows timing charts in the read test operation of the power supply control circuit 50.

With reference to FIG. 17, the power supply control circuit 50 contains P-channel MOS transistors PA31 and PA32. In the P-channel MOS transistor PA31, its source is connected to the first power supply (VDD), and its drain is connected to the output end (the memory cell 10). The P-channel MOS transistor PA31 outputs the first power supply voltage VDD as the power supply voltage Vcell to the drain on the basis of the test signal TEST supplied to the gate. In the P-channel MOS transistor PA32, its source is connected to the power supply voltage (Vc), and its drain is connected to the output end (the memory cell 10). In such a configuration, the voltage outputted as the power supply voltage Vcell is switched to between the first power supply voltage VDD and the power supply voltage Vcell in accordance with the test signals TEST and TESTB.

The operation of the read test in the power supply control circuit 50 shown in FIG. 17 will be described below with reference to FIG. 18. The operation between the times T1 and T5 shown in FIG. 18 corresponds to the operation between the times T1 and T5 shown in FIG. 16. In the period except the SNM reduction process period (between the times T2 and T3) of the period between the times T1 and T5, the test signal TEST is set to the low level, and the test signal TESTB is set to the high level, and the power supply control circuit 40 supplies the first power supply voltage VDD as the power supply voltage Vcell to the memory cell 10, similarly to the ordinary mode.

On the other hand, in the SNM reduction process period (between the times T2 and T3), the test signal TEST of the high level (the test signal TESTB of the low level) is set to the power supply control circuit 50. In this state, the P-channel MOS transistor PA32 is turned on, and the P-channel MOS transistor PA31 is turned off, and the memory cell 10 and the first power supply (VDD) are separated, and the voltage Vc is applied as the power supply voltage Vcell to the memory cell 10. It should be noted that the voltage Vc is possible to easily set any level by receiving from a test terminal or dividing the first power supply voltage VDD. For example, the signal level (the voltage VW) of the power supply voltage Vcell is set in such a manner that the held data by the memory cell 10, the SNM of which is smaller than the predetermined value is inverted.

As mentioned above, in the SRAM in this embodiment, the pull-up performance of the data holding node in the memory cell 10 (the logical threshold voltage of the inverter) is controlled by setting the power supply voltage of the memory cell 10 to any voltage Vc. Thus, the SNM of the memory cell 10 can be set to a proper value. That is, according to the present invention, the easiness of the inversion of the data held by the memory cell 10 is set to a desirable level. Thus, it is possible to carry out the read SNM test corresponding to the SNM value of the memory cell targeted for the rejection and the test condition. Therefore, according to the present invention, it is possible to reserve a high yield while attaining high quality.

The first embodiment and the third embodiment can be combined in a range that no inconsistence from the technical aspect is present. In this case, in the SNM reduction process period (between the times T2 and T3), the pre-charging circuit 20 is controlled, and a predetermined voltage is supplied to the bit lines BL1 and BL2. Also, the power supply voltage Vcell to the memory cell 10 is changed to the voltage Vc. Consequently, the SNM of the memory cell can be largely reduced, as compared with the first and third embodiments. Similarly, any of the first to third embodiments can be arbitrarily selected and combined.

In the SRAM in the third embodiment, since the power supply voltage Vcell is set to a value higher than the first power supply voltage VDD in the ordinary mode, the memory cell in the abnormal state whose SNM is small can be detected even in the write test.

Figure 19:
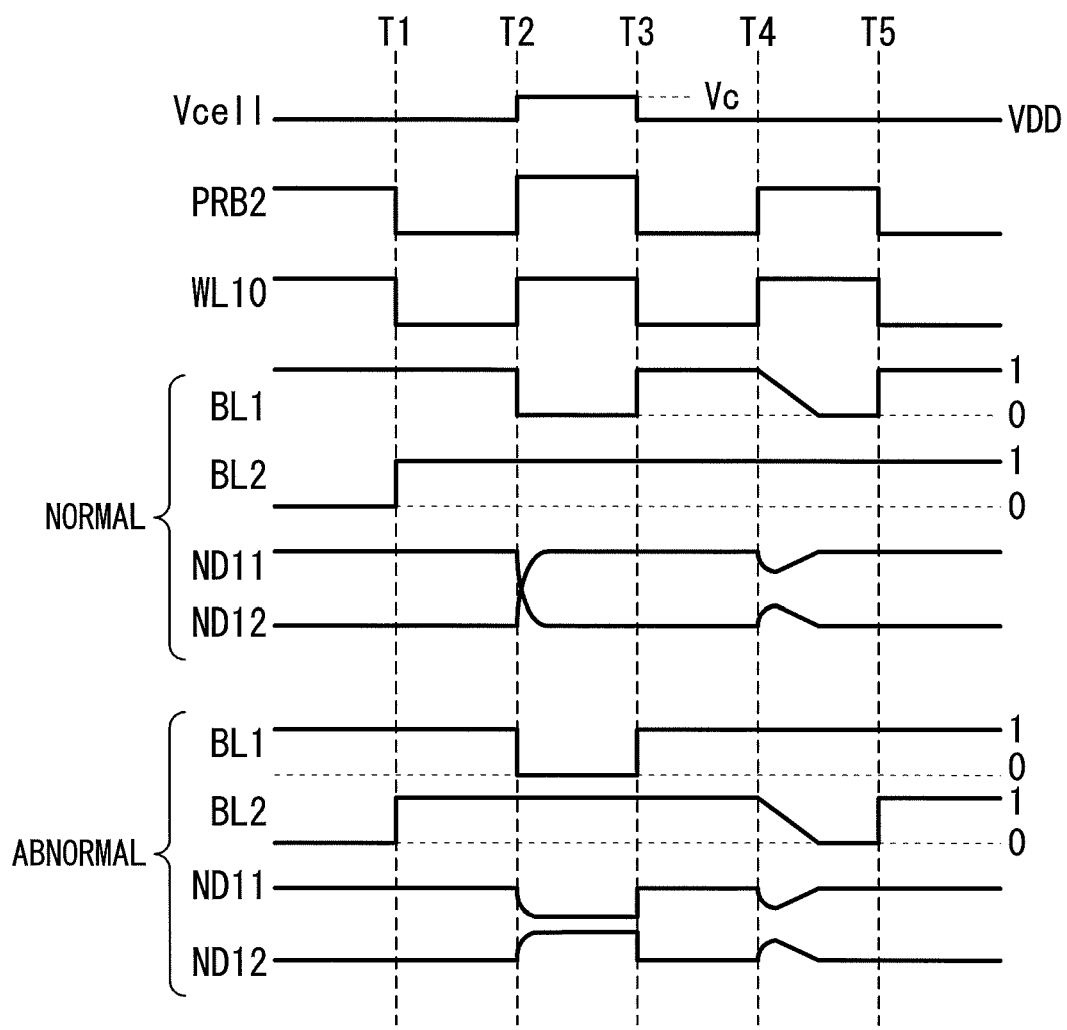
FIG. 19 shows timing charts of the SRAM in the third embodiment in a write test.

The detail of the operation of the write test in the SRAM in the third embodiment will be described below with reference to FIGS. 18 and 19. FIG. 18 shows the timing charts in the write test operation of the power supply control circuit 50 according to the present invention. FIG. 19 shows timing charts in the write test operation for the SRAM in the third embodiment.

In the write test mode, a write of a data (until the time T1), the pre-charging of the bit lines (between the times T1 and T2), the write margin reduction process and the write of the data (between the times T2 and T3), the pre-charging of the bit lines (between the times T3 and T4), the read of the data (between the times T4 and T5), and the determination of the normal/abnormal state (after the time T5) are carried out.

At first, until the time T1, the word line WL10 is activated, and "1" (the high level) is written to the node ND11, and "0" (the low level) is written to the node ND12. At this time, the pre-charging circuit 20 disconnects the connection between the first power supply voltage VDD and each of the bit lines BL1 and BL2 on the basis of the pre-charge control signal PRB2 of the high level, similarly to the ordinary mode. At the time T1, the pre-charge control signal PRB1 is changed to the low level (VL), and the word line WL10 is inactivated. Consequently, the memory cell 10 is separated from the bit lines BL1 and BL2, and the bit lines BL1 and BL2 are pre-charged to the high level by the pre-charging circuit 20.

Between the times T2 and T3, the pre-charge control signal PRB2 is changed to the high level, and the word line WL10 is activated, and the inversion data of the data held by the memory cell 10 is written to the memory cell 10. Here, "0" (the low level) is written to the node ND11, and "1" (the high level) is written to the node ND12. At this time, the power supply control circuit 50 supplies the voltage Vc, which is higher than the first power supply voltage VDD, as the power supply voltage Vcell to the memory cell 10. Consequently, the load resistance of the memory cell 10 (the on-resistances of the P-channel MOS transistors P11 and P12) becomes lower than the usual case. Thus, it is difficult to pull the node ND11, which holds the data "1", down to the low level "0" (the writing is difficult). That is, by decreasing the power supply voltage, a disturbance to the memory cell 10 is changed, and the data is written while the write margin is reduced.

Here, when the memory cell 10 is in the normal state, even if the voltage Vc higher than the first power supply voltage VDD is supplied (disturbed) as the power supply voltage Vcell, the signal levels of the nodes ND11 and ND12 are inverted on the basis of the write data. That is, when the memory cell 10 is in the normal state, the data set to the bit lines BL1 and BL2 are correctly written to the memory cell 10. On the other hand, in a case of the memory cell in which the SNM is low and the defect generation rate is high, the voltage of the node ND11 does not fall below the threshold voltage, and the held data is not inverted. That is, in a case of the memory cell in the abnormal state, the inversion data set to the bit lines BL1 and BL2 are not written to the memory cell 10.

Between the times T3 and T4, the pre-charging process for the read process is carried out. In detail, the pre-charge control signal PRB2 is changed to the low level (VL), and the word line WL10 is inactivated. Consequently, the pre-charging circuit 20 pre-charges the bit lines BL1 and BL2 to the high level. In succession, between the times T4 and T5, the data is read from the memory cell 10. Here, the pre-charge control signal PRB1 is changed to the high level (VH), and the word line WL20 is activated. Consequently, the first power supply voltage VDD and the bit lines BL1 and BL2 are separated, and the data is read from the memory cell 10.

When the data read from the memory cell 10 between the times T4 and T5 and the data written between the times T2 and T3 are coincident, the memory cell 10 is determined to be in the normal state, and when both are different, the memory cell 10 is determined to be in the abnormal state.

In the SRAM in this embodiment, when the data is written, the power supply voltage Vcell to the memory cell 10 is set to be higher than the first power supply voltage VDD. Consequently, the setting can be carried out in such a manner that the write margin of the memory cell 10 is reduced and the write of the inversion data is made difficult. In the write test mode, the voltage Vc is set to a proper value higher than the power supply voltage VDD, and the control is carried out in such a manner that the inversion data cannot be written to the memory cell in the abnormal state whose SNM is small, and the memory cell can be detected as the memory cell in the abnormal state. With reference to FIG. 18, the power supply control circuit 50 can output a voltage, which is higher than the power supply voltage VDD, as the power supply voltage Vcell on the basis of the value of the voltage Vc, similarly to the read test mode. Since the voltage Vc can be set to any value higher than the power supply voltage VDD, the detection sensibility of the memory cell in the abnormal state can be changed even in the write test. For example, the signal level (the voltage VW) of the power supply voltage Vcell is changed in such a way that the held data by the memory cell 10, the SNM of which is lower than a predetermined value is inverted. Thus, according to the SRAM in this embodiment, the detection sensibility of the memory cell in the abnormal state to the write can be changed on the basis of the specification of the circuit and a design condition.

As mentioned above, according to the SRAM in this embodiment, the detection sensibility of the memory cell in the abnormal state can be improved not only in the read test but also in the write test.

Even in the write mode, the second and third embodiments can be combined in the range that no inconsistence from the technical aspect is present, similarly to the read mode.

As mentioned above, the embodiments of the present invention have been described in detail. However, the specific configurations are not limited to the above-mentioned embodiments. Also, even the modification in the range without departing from the scope and spirit of the present invention is included in the present invention.

What is claimed is:

1. An SRAM comprising:
a memory cell; and
a control circuit configured to change in a test mode of a read test mode and a write test mode, a signal level of a signal which is used for an access to said memory cell in an ordinary mode, to apply a disturbance to said memory cell,
wherein said control circuit optionally set the signal level based on the disturbance.

2. The SRAM according to claim 1, further comprising:
a precharge circuit configured to precharge bit lines connected with said memory cell by use of a power supply voltage, before a data write or a data read to said memory cell in the ordinary mode,
wherein before the data read in the read test mode, said control circuit supplies a precharge signal with a voltage level lower than the power supply voltage, to said precharge circuit, and
said precharge circuit precharges said bit lines by use of said precharge signal.

3. The SRAM according to claim 1, wherein before the data read in the read test mode, said control circuit activates a word line connected with said memory cell by use of a voltage higher than in the ordinary mode.

4. The SRAM according to claim 3, wherein said control circuit activates said word line by use of a voltage lower than in the ordinary mode, when an inversion data of a data held by said memory cell is written in said memory cell in the write test mode.

5. The SRAM according to claim 1, wherein before the data read in the read test mode, said control circuit changes the power supply voltage to be supplied to said memory cell, into a voltage lower than in the ordinary mode.

6. The SRAM according to claim 5, wherein the power supply voltage to be supplied to said memory cell is changed in the write test mode, into a voltage higher than in the ordinary mode, when an inversion data of a data held by said memory cell is written in said memory cell.

7. A method of testing an SRAM, comprising:
writing a data in a memory cell; and
applying a disturbance to said memory cell by changing in a test mode of a read test mode and a write test mode, a signal level of a signal which is used for an access to said memory cell in an ordinary mode,
wherein said signal level is optionally set based on the disturbance.

8. The method according to claim 7, wherein said applying comprises:
supplying a precharge signal with a voltage level which is lower than in the ordinary mode, to a precharge circuit, before a data read in the read test mode,
wherein said method further comprises:
precharging bit lines connected with said memory cell by said precharge circuit in response to the precharge signal; and
reading the data from said memory cell.

9. The method according to claim 7, wherein said applying comprises:
activating a word line connected with said memory cell by use of a voltage which is higher than in the ordinary mode, before the data read in the read test mode.

10. The method according to claim 9, wherein said applying comprises:
activating said word line by use of a voltage which is lower than in the ordinary mode in the write test mode, when writing in said memory cell, an inversion data to the data written in said memory cell.

11. The method according to claim 7, wherein said applying comprises:
changing a power supply voltage to be supplied to said memory cell to a voltage which is lower than in the ordinary mode before the data read in the read test mode.

12. The method according to claim 11, wherein said applying comprises:
changing in the write test mode, the power supply voltage to a voltage which is higher than in the ordinary mode when writing in said memory cell, an inversion data to the data written in said memory cell.

* * * * *